US012684778B2

(12) United States Patent
Or-Bach et al.

(10) Patent No.: US 12,684,778 B2
(45) **Date of Patent: *Jul. 14, 2026**

(54) 3D MEMORY SEMICONDUCTOR DEVICES AND STRUCTURES WITH MEMORY CELLS

(71) Applicant: Monolithic 3D Inc., Klamath Falls, OR (US)

(72) Inventors: Zvi Or-Bach, Haifa (IL); Jin-Woo Han, San Jose, CA (US); Eli Lusky, Ramat-Gan (IL)

(73) Assignee: Monolithic 3D Inc., Allen, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 19/004,160

(22) Filed: Dec. 27, 2024

(65) Prior Publication Data

US 2025/0142825 A1 May 1, 2025

Related U.S. Application Data

(63) Continuation-in-part of application No. 18/738,967, filed on Jun. 10, 2024, now Pat. No. 12,225,727,
(Continued)

(51) Int. Cl.
H10B 43/27 (2023.01)
H01L 23/00 (2006.01)
(Continued)

(52) U.S. Cl.
CPC ............. H10B 43/27 (2023.02); H01L 24/08 (2013.01); H01L 25/0657 (2013.01); H01L 25/18 (2013.01); H10B 80/00 (2023.02); H01L

2224/08145 (2013.01); *H01L 2924/1431* (2013.01); *H01L 2924/14511* (2013.01)

(58) Field of Classification Search
CPC ........ H10B 43/27; H10B 80/00; H10B 41/10; H10B 41/27; H10B 43/10; H10B 51/20; H10B 41/20; H10B 41/40; H10B 43/20; H10B 43/40; H01L 25/0657; H01L 25/18; H01L 2224/08145; H01L 2924/1431; H01L 2924/14511; G11C 16/24; G11C 16/26; G11C 16/28; G11C 16/10; G11C 16/16;
(Continued)

(56) References Cited

U.S. PATENT DOCUMENTS

| | | | |
|---|---|---|---|
| 11,963,373 B1 * | 4/2024 | Or-Bach | G11C 5/025 |
| 2018/0069052 A1 * | 3/2018 | Sekar | H10B 41/41 |

(Continued)

*Primary Examiner* — Mamadou L Diallo
(74) *Attorney, Agent, or Firm* — PatentPC; Bao Tran

(57) ABSTRACT

A 3D memory device including: a first structure including a plurality of memory cells, where each memory cell of the plurality of memory cells includes at least one memory transistor, where each of the at least one memory transistor includes a source, a drain, and a channel, where the memory cell includes at least one charge trap structure, and where the at least one memory transistor is self-aligned to an overlaying another of the at least one memory transistor, both being processed following a same lithography step; and a control level including a memory controller circuit, where the control level includes a plurality of temperature sensors, where the control level is bonded to the first structure, and where the bonded includes hybrid bonding.

20 Claims, 15 Drawing Sheets

Three hole process - 1

Related U.S. Application Data which is a continuation-in-part of application No. 18/605,401, filed on Mar. 14, 2024, now Pat. No. 12,041,792, which is a continuation-in-part of application No. 18/407,096, filed on Jan. 8, 2024, now Pat. No. 11,963,373, which is a continuation-in-part of application No. 18/384,304, filed on Oct. 26, 2023, now Pat. No. 11,910,622, which is a continuation-in-part of application No. 18/231,235, filed on Aug. 7, 2023, now Pat. No. 11,854,646, which is a continuation-in-part of application No. 17/948,225, filed on Sep. 20, 2022, now Pat. No. 11,763,864, which is a continuation-in-part of application No. 17/681,767, filed on Feb. 26, 2022, now Pat. No. 11,482,540, which is a continuation-in-part of application No. 17/484,394, filed on Sep. 24, 2021, now Pat. No. 11,296,106, which is a continuation-in-part of application No. 17/346,295, filed on Jun. 14, 2021, now Pat. No. 11,158,652, which is a continuation-in-part of application No. 17/235,879, filed on Apr. 20, 2021, now Pat. No. 11,069,697, which is a continuation-in-part of application No. 17/099,706, filed on Nov. 16, 2020, now Pat. No. 11,018,156, which is a continuation-in-part of application No. 16/836,659, filed on Mar. 31, 2020, now Pat. No. 10,892,016.

(60) Provisional application No. 62/952,222, filed on Dec. 21, 2019, provisional application No. 62/897,364, filed on Sep. 8, 2019, provisional application No. 62/856,732, filed on Jun. 3, 2019, provisional application No. 62/831,080, filed on Apr. 8, 2019.

(51) Int. Cl.
| | |
|---|---|
| *H01L 25/065* | (2023.01) |
| *H01L 25/18* | (2023.01) |
| *H10B 80/00* | (2023.01) |

(58) Field of Classification Search
CPC . G11C 16/0466; G11C 16/0483; G11C 16/08; G11C 7/065
See application file for complete search history.

(56) References Cited

U.S. PATENT DOCUMENTS

| | | | |
|---|---|---|---|
| 2019/0088589 A1* | 3/2019 | Zhu | H10B 43/40 |
| 2023/0128177 A1* | 4/2023 | Oowada | G11C 16/0483 |
| | | | 365/185.17 |
| 2024/0224545 A1* | 7/2024 | Or-Bach | H10B 43/10 |
| 2024/0334702 A1* | 10/2024 | Or-Bach | H10B 43/40 |

* cited by examiner

Three hole process - 1

Three Hole Process - 2

Another Simplified Process Flow; two-hole process

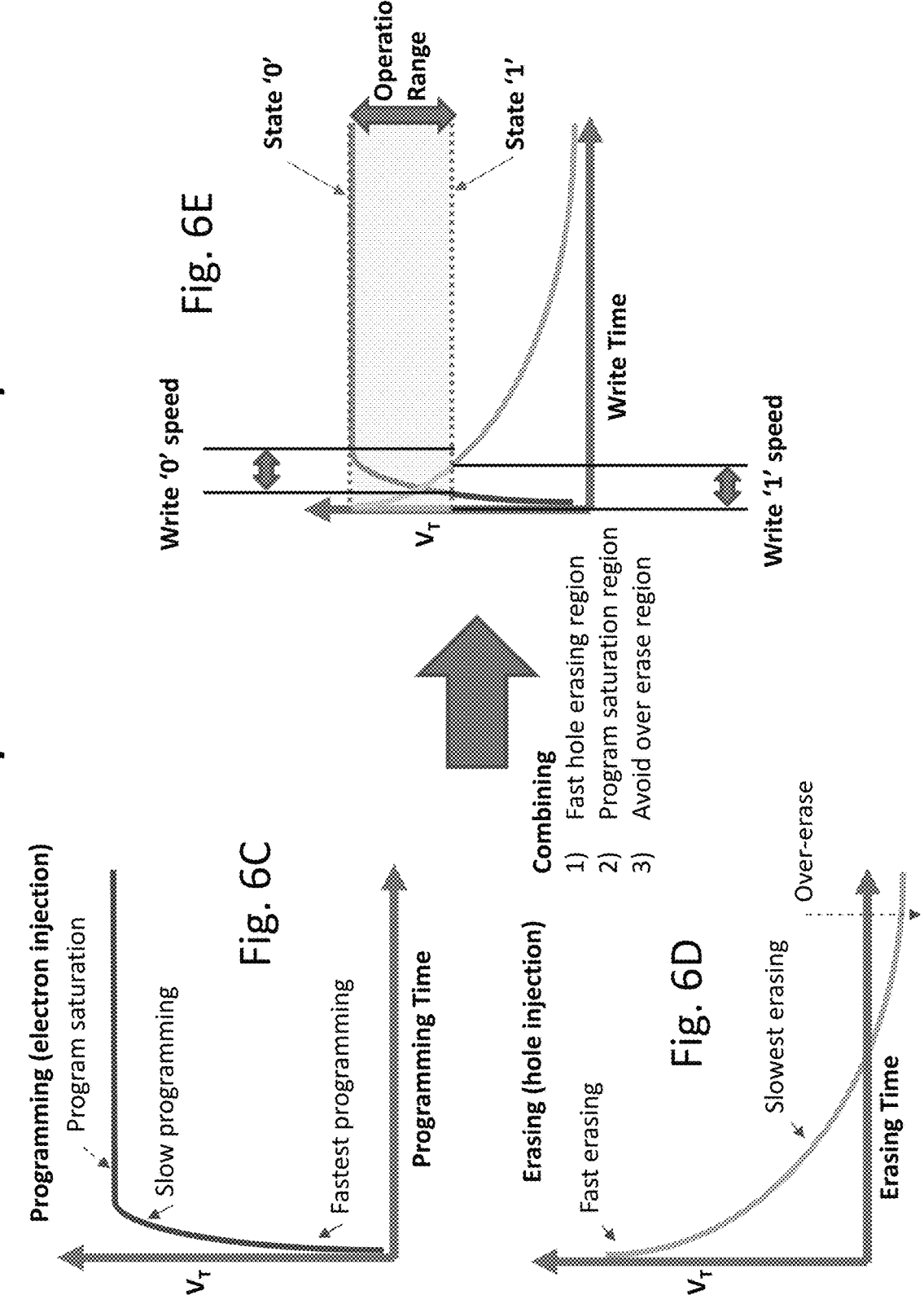

Novel Reference Current or Voltage

Traditional Charge Trap Memory

Pre-saturation Mode Charge Trap Memory

1

3D MEMORY SEMICONDUCTOR DEVICES AND STRUCTURES WITH MEMORY CELLS

BACKGROUND OF THE INVENTION

1. Field of the Invention

This application relates to the general field of Integrated Circuit (IC) devices and fabrication methods, and more particularly to multilayer or Three Dimensional Integrated Memory Circuit (3D-Memory) and Three Dimensional Integrated Logic Circuit (3D-Logic) devices and fabrication methods.

2. Discussion of Background Art

Over the past 40 years, there has been a dramatic increase in functionality and performance of Integrated Circuits (ICs). This has largely been due to the phenomenon of "scaling": i.e., component sizes such as lateral and vertical dimensions within ICs have been reduced ("scaled") with every successive generation of technology. There are two main classes of components in Complementary Metal Oxide Semiconductor (CMOS) ICs, namely transistors and wires. With "scaling", transistor performance and density typically improve and this has contributed to the previously-mentioned increases in IC performance and functionality. However, wires (interconnects) that connect together transistors degrade in performance with "scaling". The situation today is that wires dominate the performance, functionality and power consumption of ICs.

3D stacking of semiconductor devices or chips is one avenue to tackle the wire issues. By arranging transistors in 3 dimensions instead of 2 dimensions (as was the case in the 1990s), the transistors in ICs can be placed closer to each other. This reduces wire lengths and keeps wiring delay low and wire.

There are many techniques to construct 3D stacked integrated circuits or chips including:

Through-silicon via (TSV) technology: Multiple layers of dice are constructed separately. Following this, they can be bonded to each other and connected to each other with through-silicon vias (TSVs).

Monolithic 3D technology: With this approach, multiple layers of transistors and wires can be monolithically constructed. Some monolithic 3D and 3DIC approaches are described in U.S. Pat. Nos. 8,273,610, 8,298,875, 8,362,482, 8,378,715, 8,379,458, 8,450, 804, 8,557,632, 8,574,929, 8,581,349, 8,642,416, 8,669,778, 8,674,470, 8,687,399, 8,742,476, 8,803, 206, 8,836,073, 8,902,663, 8,994,404, 9,023,688, 9,029,173, 9,030,858, 9,117,749, 9,142,553, 9,219, 005, 9,385,058, 9,406,670, 9,460,978, 9,509,313, 9,640,531, 9,691,760, 9,711,407, 9,721,927, 9,799, 761, 9,871,034, 9,953,870, 9,953,994, 10,014,292, 10,014,318, 10,515,981, 10,892,016, 10,991,675, 11,121,121, 11,502,095, 10,892,016, 11,270,988; and pending U.S. patent application Publications and applications, Ser. Nos. 14/642,724, 15/150,395, 15/173,686, 62/651,722; 62/681,249, 62/713,345, 62/770,751, 62/952,222, 62/824,288, 63/075,067, 63/091,307, 63/115,000, 63/220,443, 2021/0242189, 2020/ 0013791; and PCT Applications (and Publications): PCT/US2010/052093, PCT/US2011/042071 (WO2012/015550), PCT/US2016/52726 (WO2017053329), PCT/US2017/052359 (WO2018/ 071143), PCT/US2018/016759 (WO2018144957),

2

PCT/US2018/52332 (WO 2019/060798), PCT/ US2021/44110, and PCT/US22/44165. The entire contents of all of the foregoing patents, publications, and applications are incorporated herein by reference.

Electro-Optics: There is also work done for integrated monolithic 3D including layers of different crystals, such as U.S. Pat. Nos. 8,283,215, 8,163,581, 8,753,913, 8,823,122, 9,197,804, 9,419,031, 9,941,319, 10,679, 977, 10,943,934, 10,998,374, 11,063,071, and 11,133, 344. The entire contents of all of the foregoing patents, publications, and applications are incorporated herein by reference.

In addition, the entire contents of U.S. Pat. Nos. 11,069, 697, 11,018,156, 10,892,016, 10,622,365, 10,297,599, 9,953,994; applications 63/091,307, 63/075,067, 62/952,222, 62/897,364, 62/856,732, and 62/831,080 are incorporated herein by reference.

Additionally the 3D technology according to some embodiments of the invention may enable some very innovative IC devices alternatives with reduced development costs, novel and simpler process flows, increased yield, and other illustrative benefits.

SUMMARY

The invention relates to multilayer or Three Dimensional Integrated Circuit (3D IC) devices and fabrication methods. Important aspects of 3D IC are technologies that allow layer transfer. These technologies include technologies that support reuse of the donor wafer, and technologies that support fabrication of active devices on the transferred layer to be transferred with it.

In one aspect, a 3D memory device, the device including: a plurality of memory cells, where each of the plurality of memory cells includes at least one memory transistor, where each of the at least one memory transistor includes a source, a drain and a channel: a plurality of bit-line pillars, where each of the plurality of bit-line pillars is directly connected to a plurality of the source or the drain, where the bit-line pillars are vertically oriented, where the channel is horizontally oriented, and where the channel includes a circular shape or an ellipsoidal shape.

In another aspect, a 3D memory device, the device including: a plurality of memory cells, where each of the plurality of memory cells includes at least one memory transistor, where each of the at least one memory transistor includes a source, a drain and a channel: a plurality of bit-line pillars, where each of the plurality of bit-line pillars is directly connected to a plurality of the source or the drain, where the bit-line pillars are vertically oriented, and where the channel is horizontally oriented and includes a channel width longer than 5 nm and shorter than 25 nm.

And in another aspect, a 3D memory device, the device including: a plurality of memory cells, where each of the plurality of memory cells includes at least one memory transistor, where each of the at least one memory transistor includes a source, a drain and a channel: a plurality of bit-line pillars, where each of the plurality of bit-line pillars is directly connected to a plurality of the source or the drain, where the bit-line pillars are vertically oriented, where at least one of the plurality of the memory cells include a tunneling oxide thinner than 1 nm, and where at least one of the plurality of the memory cells include a tunneling oxide thicker than 3 nm.

And in another aspect, a 3D memory device, the device including: a plurality of memory cells, where each of the plurality of memory cells includes at least one memory transistor, where each of the at least one memory transistor includes a source and a drain: a plurality of bit-line pillars, where each of the plurality of bit-line pillars is directly connected to a plurality of the source or the drain, where each of the plurality of bit-line pillars includes metal atoms such that the plurality of bit-line pillars have at least partial metallic properties; and a thermal path from the bit-line pillars to an external surface of the device to remove heat.

And in another aspect, a 3D memory device, the device including: a plurality of memory cells, where each of the plurality of memory cells includes at least one memory transistor, where each of the at least one memory transistor includes a source and a drain: a plurality of bit-line pillars, where each of the bit-line pillars is directly connected to a plurality of the source or the drain; and a thermal path from the bit-line pillars to an external surface of the device to remove heat.

And in another aspect, a 3D memory device, the device including: a plurality of memory cells, where each of the plurality of memory cells includes at least one memory transistor, where each of the at least one memory transistor includes a source, a channel and a drain; and a plurality of bit-line pillars, where each of the bit-line pillars is directly connected to a plurality of the sources or drains, where the channel includes crystallized polysilicon, and where the crystallized polysilicon has been crystallized from a heat sourced from the source or drain of the channel.

And in another aspect, a 3D memory device, the device including: a plurality of memory cells, where each memory cell of the plurality of memory cells includes at least one memory transistor, where each of the at least one memory transistor includes a source, a drain, and a channel; and a plurality of bit-line pillars, where each bit-line pillar of the plurality of bit-line pillars is directly connected to a plurality of the source or the drain, where the bit-line pillars are vertically oriented, where the channel is horizontally oriented, and where the channel is isolated from another channel disposed directly above the channel.

And in another aspect, a 3D memory device, the device including: a plurality of memory cells, where each memory cell of the plurality of memory cells includes at least one memory transistor, where each of the at least one memory transistor includes a source, a drain, and a channel; and a plurality of bit-line pillars, where each bit-line pillar of the plurality of bit-line pillars is directly connected to a plurality of the source or the drain, where the bit-line pillars are vertically oriented, and where the plurality of memory cells include a partially or fully metalized source, and/or a partially or fully metalized drain.

And in another aspect, a 3D memory device, the device including: a plurality of memory cells, where each memory cell of the plurality of memory cells includes at least one memory transistor, where each of the at least one memory transistor includes a source, a drain, and a channel; and a plurality of bit-line pillars, where each bit-line pillar of the plurality of bit-line pillars is directly connected to a plurality of the source or the drain, where the bit-line pillars are vertically oriented, and where the channel includes crystallized polysilicon.

And in another aspect, a 3D memory device, the device including: a plurality of memory cells, where each memory cell of the plurality of memory cells includes at least one memory transistor, where each of the at least one memory transistor includes a source, a drain, and a channel: a plurality of bit-line pillars, where each bit-line pillar of the plurality of bit-line pillars is directly connected to a plurality of the source or the drain, where the bit-line pillars are vertically oriented, where the channel is horizontally oriented; and a level of memory control circuits, where the memory control circuits is disposed either above or below the plurality of memory cells.

And in another aspect, a 3D memory device, the device including: a plurality of memory cells, where each memory cell of the plurality of memory cells includes at least one memory transistor, where each of the at least one memory transistor includes a source, a drain, and a channel; and a plurality of bit-line pillars, where each bit-line pillar of the plurality of bit-line pillars is directly connected to a plurality of the source or the drain, where the bit-line pillars are vertically oriented, and where the plurality of memory cells are organized as at least four independently controlled memory arrays.

And in another aspect, a 3D memory device, the device including: a plurality of memory cells, where each memory cell of the plurality of memory cells includes at least one memory transistor, where each of the at least one memory transistor includes a source, a drain, and a channel; and a plurality of bit-line pillars, where each bit-line pillar of the plurality of bit-line pillars is directly connected to a plurality of the source or the drain, where the bit-line pillars are vertically oriented, and where at least one of the plurality of the memory cells include a tunneling oxide thinner than 1 nm.

And in another aspect, a 3D memory device, the device including: a plurality of memory cells, where each memory cell of the plurality of memory cells includes at least one memory transistor, where each of the at least one memory transistor includes a source, a drain, and a channel: a plurality of bit-line pillars, where each bit-line pillar of the plurality of bit-line pillars is directly connected to a plurality of the source or the drain, where the bit-line pillars are vertically oriented, where the channel is horizontally oriented, where the plurality of memory cells include a partially or fully metalized source, and/or, a partially or fully metalized drain, and where the plurality of bit-line pillars include a thermally conductive path from the plurality of memory cells to an external surface of the device.

And in another aspect, a 3D memory device, the device including: a plurality of memory cells, where each memory cell of the plurality of memory cells includes at least one memory transistor, where each of the at least one memory transistor includes a source, a drain, and a channel; and a plurality of bit-line pillars, where each bit-line pillar of the plurality of bit-line pillars is directly connected to a plurality of the source or the drain, where the plurality of bit-line pillars are vertically oriented, where the channel is horizontally oriented, where a plurality of the channels has been recrystallized, and where the recrystallized was initiated from the source and/or the drain.

And in another aspect, a 3D memory device, the device including: a plurality of memory cells, where each memory cell of the plurality of memory cells includes at least one memory transistor, where each of the at least one memory transistor includes a source, a drain, and a channel; and a plurality of bit-line pillars, where each bit-line pillar of the plurality of bit-line pillars is directly connected to a plurality of the source or the drain, where the plurality of bit-line pillars are vertically oriented, where the channel is horizontally oriented, where a plurality of the channels has been recrystallized, and where the recrystallized was initiated from the source and/or the drain.

And in another aspect, a 3D memory device, the device including: a plurality of memory cells, where each memory cell of the plurality of memory cells includes at least one memory transistor, where each of the at least one memory transistor includes a source, a drain, and a channel; and a plurality of bit-line pillars, where each bit-line pillar of the plurality of bit-line pillars is directly connected to a plurality of the source or the drain, where the bit-line pillars are vertically oriented, where the channel is horizontally oriented, and where the device includes a temperature sensor.

And in another aspect, a 3D memory device, the device including: a plurality of memory cells, where each memory cell of the plurality of memory cells includes at least one memory transistor, where each of the at least one memory transistor includes a source, a drain, and a channel; and a plurality of bit-line pillars, where each bit-line pillar of the plurality of bit-line pillars is directly connected to a plurality of the source or the drain, where the plurality of bit-line pillars are vertically oriented, where the channel is horizontally oriented, where a plurality of the channels are connected to a body pillar, and where the body pillar is at least temporary connected to a negative bias.

And in another aspect, a 3D memory device, the device including: a plurality of memory cells, where each memory cell of the plurality of memory cells includes at least one memory transistor, where each of the at least one memory transistor includes a source, a drain, and a channel: a plurality of bit-line pillars, where each bit-line pillar of the plurality of bit-line pillars is directly connected to a plurality of the source or the drain, where the bit-line pillars are vertically oriented, where the channel is horizontally oriented; and a memory controller circuit, where the memory controller circuit is capable to perform a self-differential read cycle.

And in another aspect, a 3D memory device, the device including: a plurality of memory cells, where each memory cell of the plurality of memory cells includes at least one memory transistor, where each of the at least one memory transistor includes a source, a drain, and a channel; and a plurality of bit-line pillars, where each bit-line pillar of the plurality of bit-line pillars is directly connected to a plurality of the source or the drain, where the plurality of bit-line pillars are vertically oriented, where the channel is horizontally oriented, where each of the at least one memory transistor is directly connected to at least one of the plurality of bit-line pillars, where the plurality of memory cells include a metalized source and/or a metalized drain, where the metalized source includes a partially or fully metalized source structure, where the metalized drain includes a partially or fully metalized drain structure, where the metalized source includes two metal structures, and where the two metal structures include a tungsten structure.

And in another aspect, a 3D memory device, the device including: a plurality of memory cells, where each memory cell of the plurality of memory cells includes at least one memory transistor, where each of the at least one memory transistor includes a source, a drain, and a channel; and a plurality of bit-line pillars, where each bit-line pillar of the plurality of bit-line pillars is directly connected to a plurality of the source or the drain, where the plurality of bit-line pillars are vertically oriented, where the channel is horizontally oriented, and where at least one of the plurality of bit-line pillars include an inner tungsten structure and an outer silicidation metal structure in contact with at least one of the channel.

And in another aspect, a 3D memory device, the device including: a plurality of memory cells, where each memory cell of the plurality of memory cells includes at least one memory transistor, where each of the at least one memory transistor includes a source, a drain, and a channel: a plurality of bit-line pillars, where each bit-line pillar of the plurality of bit-line pillars is directly connected to a plurality of the source or the drain, where the plurality of bit-line pillars are vertically oriented, where the channel is horizontally oriented, where the at least one memory transistor is self-aligned to an overlaying another the at least one memory transistor, both being processed following a same lithography step, where at least one of the channel include a first facet and a second facet controlled by a first gate and a second gate; and a memory control circuit controlling independently the first gate and the second gate.

And in another aspect, a 3D memory device, the device including: a first structure including a plurality of memory cells, where each memory cell of the plurality of memory cells includes at least one memory transistor, where each of the at least one memory transistor includes a source, a drain, and a channel: a plurality of memory-line pillars, where each memory-line pillar of the plurality of memory-line pillars is directly connected to a plurality of the source or the drain, where the plurality of memory-line pillars are vertically oriented, where the channel is horizontally oriented, where a plurality of the channel are connected to a body pillar, where the body pillar is at least temporary connected to a negative bias, where the at least one memory transistor is self-aligned to an overlaying another the at least one memory transistor, both being processed following a same lithography step; and a control level including a memory controller circuit, where the control level is bonded to the first structure, and where the bonded includes hybrid bonding.

And in another aspect, a 3D memory device, the device including: a first structure including a plurality of memory cells, where each memory cell of the plurality of memory cells includes at least one memory transistor, where each of the at least one memory transistor includes a source, a drain, and a channel: a plurality of memory-line pillars, where each memory-line pillar of the plurality of memory-line pillars is directly connected to a plurality of the source or the drain, where the plurality of memory-line pillars are vertically oriented, where the at least one memory transistor is self-aligned to an overlaying another the at least one memory transistor, both being processed following a same lithography step; and a control level including a memory controller circuit, where the memory controller circuit includes a row buffer, where the control level is bonded to the first structure, and where the bonded includes hybrid bonding.

And in another aspect, a 3D memory device, the device including: a first structure including a plurality of memory cells, where each memory cell of the plurality of memory cells includes at least one memory transistor, where each of the at least one memory transistor includes a source, a drain, and a channel: a plurality of memory-line pillars, where each memory-line pillar of the plurality of memory-line pillars is directly connected to a plurality of the source or the drain, where the plurality of memory-line pillars are vertically oriented, where the at least one memory transistor is self-aligned to an overlaying another the at least one memory transistor, both being processed following a same lithography step; and a control level including a memory controller circuit, where the control level is adapted to perform a preset operation, where the control level is bonded to the first structure, and where the bonded includes hybrid bonding.

And in another aspect, a 3D memory device, the device including: a first structure including a plurality of memory cells, where each memory cell of the plurality of memory cells includes at least one memory transistor, where each of the at least one memory transistor includes a source, a drain, the at least one memory transistor includes a source, a drain, and a channel, where the memory cell includes at least one charge trap structure, and where the at least one memory transistor is self-aligned to an overlaying another the at least one memory transistor, both being processed following a same lithography step; and a control level including a memory controller circuit, where the control level includes a plurality of voltage latch sense amplifiers, where the control level is bonded to the first structure, and where the bonded includes hybrid bonding.

And in another aspect, a 3D memory device, the device including: a first structure including a plurality of memory cells, where each memory cell of the plurality of memory cells includes at least one memory transistor, where each of the at least one memory transistor includes a source, a drain, and a channel: a plurality of memory-line pillars, where each memory-line pillar of the plurality of memory-line pillars is directly connected to a plurality of the source or the drain, where the plurality of memory-line pillars are vertically oriented, and where the at least one memory transistor is self-aligned to an overlaying another the at least one memory transistor, both being processed following a same lithography step; and a control level including a memory controller circuit, where the memory controller circuit includes a row buffer, where the control level is bonded to the first structure, and where the bonded includes hybrid bonding.

And in another aspect, a 3D memory device, the device including: a first structure including a plurality of memory cells, where each memory cell of the plurality of memory cells includes at least one memory transistor, where each of the at least one memory transistor includes a source, a drain, and a channel: a plurality of memory-line pillars, where each memory-line pillar of the plurality of memory-line pillars is directly connected to a plurality of the source or the drain, where the plurality of memory-line pillars are vertically oriented, and where the at least one memory transistor is self-aligned to an overlaying another the at least one memory transistor, both being processed following a same lithography step; and a control level including a memory controller circuit, where the memory controller circuit is adapted to perform a preset operation, where the control level is bonded to the first structure, and where the bonded includes hybrid bonding.

And in another aspect, a 3D memory device, the device including: a first structure including a plurality of memory cells, where each memory cell of the plurality of memory cells includes at least one memory transistor, where each of the at least one memory transistor includes a source, a drain, and a channel, where the memory cell includes at least one charge trap structure, and where the at least one memory transistor is self-aligned to an overlaying another the at least one memory transistor, both being processed following a same lithography step; and a control level including a memory controller circuit, where the control level includes a plurality of temperature sensors, where the control level is bonded to the first structure, and where the bonded includes hybrid bonding.

And in another aspect, a 3D memory device, the device including: a first structure including a plurality of memory cells, where each memory cell of the plurality of memory cells includes at least one memory transistor, where each of the at least one memory transistor includes a source, a drain, and a channel: a plurality of memory-line pillars, where each memory-line pillar of the plurality of memory-line pillars is directly connected to a plurality of the source or the drain, where the plurality of memory-line pillars are vertically oriented, and where the at least one memory transistor is self-aligned to an overlaying another the at least one memory transistor, both being processed following a same lithography step; and a control level including a memory controller circuit, where the memory controller circuit includes a calibration mode control circuit, where the control level is bonded to the first structure, and where the bonded includes hybrid bonding.

And in another aspect, a 3D memory device, the device including: a first structure including a plurality of memory cells, where each memory cell of the plurality of memory cells includes at least one memory transistor, where each of the at least one memory transistor includes a source, a drain, and a channel: a plurality of memory-line pillars, where each memory-line pillar of the plurality of memory-line pillars is directly connected to a plurality of the source or the drain, where the plurality of memory-line pillars are vertically oriented, and where the at least one memory transistor is self-aligned to an overlaying another the at least one memory transistor, both being processed following a same lithography step; and a control level including a memory controller circuit, where the memory controller circuit includes a redundancy control circuit, where the redundancy control circuit is adapted to replace defective memory cells, where the control level is bonded to the first structure, and where the bonded includes hybrid bonding.

And in another aspect, a 3D memory device, the device including: a first structure including a plurality of memory cells, where each memory cell of the plurality of memory cells includes at least one memory transistor, where each of the at least one memory transistor includes a source, a drain, and a channel, where the memory cell includes at least one charge trap structure, and where the at least one memory transistor is self-aligned to an overlaying another the at least one memory transistor, both being processed following a same lithography step; and a control level including a memory controller circuit, where the control level includes a plurality of latch sense amplifiers, where the control level is bonded to the first structure, and where the bonded includes hybrid bonding.

And in another aspect, a 3D memory device, the device including: a first structure including a plurality of memory cells, where each memory cell of the plurality of memory cells includes at least one memory transistor, where each of the at least one memory transistor includes a source, a drain, and a channel: a plurality of memory-line pillars, where the plurality of memory-line pillars are vertically oriented, and where the at least one memory transistor is self-aligned to an overlaying another the at least one memory transistor, both being processed following a same lithography step; and a control level including a memory controller circuit, where the memory controller circuit includes plurality of a row buffers, where the control level is bonded to the first structure, and where the bonded includes hybrid bonding.

And in another aspect, a 3D memory device, the device including: a first structure including a plurality of memory cells, where each memory cell of the plurality of memory cells includes at least one memory transistor, where each of the at least one memory transistor includes a source, a drain, and a channel: a plurality of memory-line pillars, where the plurality of memory-line pillars are vertically oriented, and where the at least one memory transistor is self-aligned to an overlaying another the at least one memory transistor, both being processed following a same lithography step; and a control level including a memory controller circuit, where the channel includes recrystallized polysilicon, where the control level is bonded to the first structure, and where the bonded includes hybrid bonding.

And in another aspect, a 3D memory device, the device including: a first structure including a plurality of memory cells, where each memory cell of the plurality of memory cells includes at least one memory transistor, where each of the at least one memory transistor includes a source, a drain, and a channel, where the memory cell includes at least one charge trap structure, and where the at least one memory transistor is self-aligned to an overlaying another the at least one memory transistor, both being processed following a same lithography step; and a control level including a memory controller circuit, where the control level includes a plurality of temperature sensors, where the control level is bonded to the first structure, and where the bonded includes hybrid bonding.

And in another aspect, a 3D memory device, the device including: a first structure including a plurality of memory cells, where each memory cell of the plurality of memory cells includes at least one memory transistor, where each of the at least one memory transistor includes a source, a drain, and a channel: a plurality of memory-line pillars, where the plurality of memory-line pillars are vertically oriented, and where the at least one memory transistor is self-aligned to an overlaying another the at least one memory transistor, both being processed following a same lithography step; and a control level including a memory controller circuit, where the memory controller circuit includes a plurality of a row buffers, where the memory controller circuit includes a configuration to perform a differential read cycle, where the control level is bonded to the first structure, and where the bonded includes hybrid bonding.

And in another aspect, a 3D memory device, the device including: a first structure including a plurality of memory cells, where each memory cell of the plurality of memory cells includes at least one memory transistor, where each of the at least one memory transistor includes a source, a drain, and a channel: a plurality of memory-line pillars, where the plurality of memory-line pillars are vertically oriented, and where the at least one memory transistor is self-aligned to an overlaying another the at least one memory transistor, both being processed following a same lithography step; and a control level including a memory controller circuit, a bottom level including a first crystallized silicon layer; and a top level including a second crystallized silicon layer, where the bottom level is overlaid by the first structure, where the first structure is overlaid by the top level, where the memory controller circuit includes a calibration mode control circuit, where the control level is bonded to the first structure, and where the bonded includes hybrid bonding.

BRIEF DESCRIPTION OF THE DRAWINGS

Various embodiments of the invention will be understood and appreciated more fully from the following detailed description, taken in conjunction with the drawings in which:

FIGS. 6C-6E are exemplary illustrations of the effects of a trap pre-saturation operation:

DETAILED DESCRIPTION

Figures 1A, 1B, 1C, 1D:
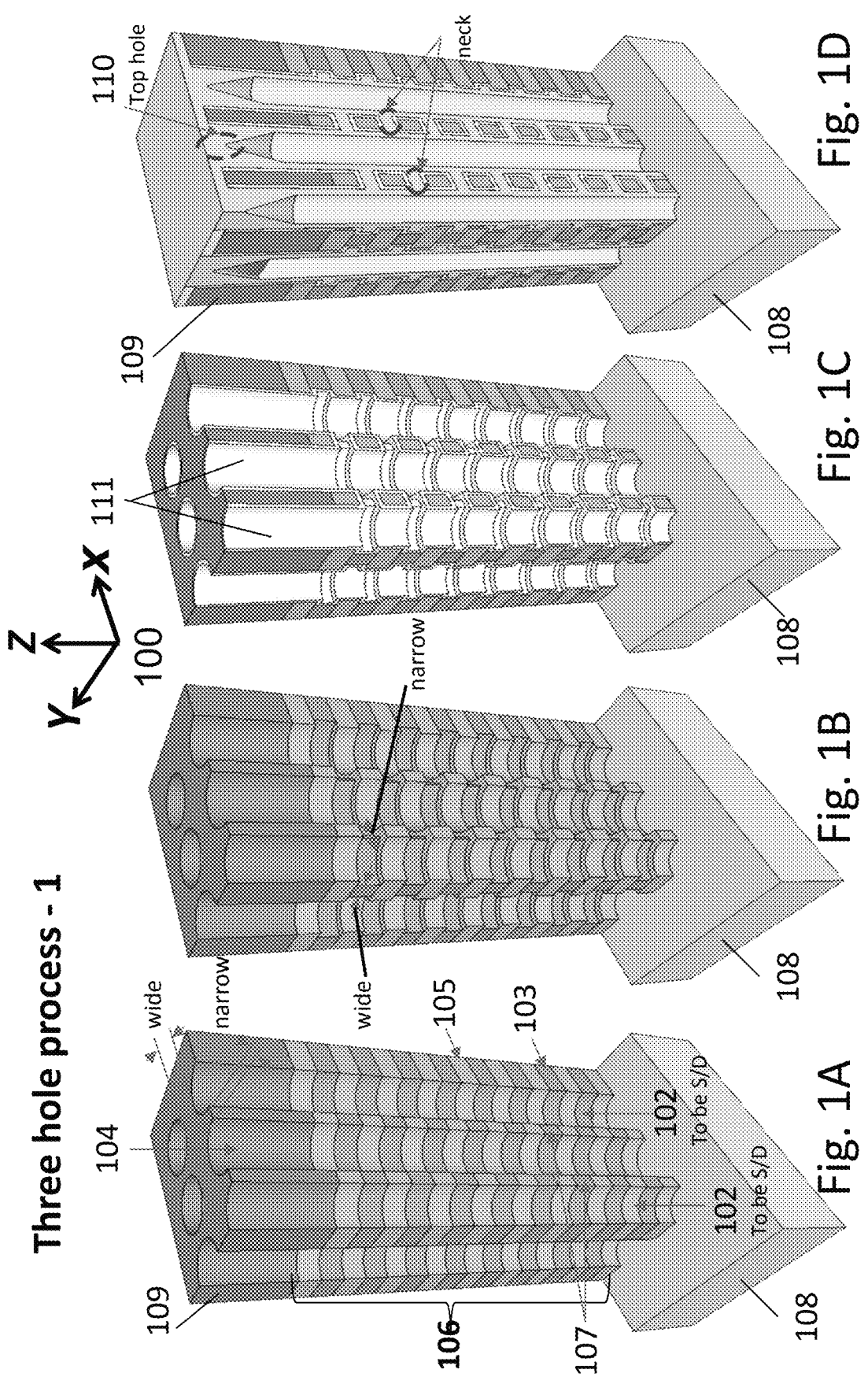
FIGS. 1A-1H are exemplary illustrations of some of the process steps to form a 3D NOR structure.

An embodiment of the invention is now described with reference to the drawing figures. Persons of ordinary skill in the art will appreciate that the description and figures illustrate rather than limit the invention and that in general the figures are not drawn to scale for clarity of presentation. Such skilled persons will also realize that many more embodiments are possible by applying the inventive principles contained herein and that such embodiments fall within the scope of the invention which is not to be limited except by any appended claims.

Some drawing figures may describe process flows for building devices. The process flows, which may be a sequence of steps for building a device, may have many structures, numerals and labels that may be common between two or more adjacent steps. In such cases, some labels, numerals and structures used for a certain step's figure may have been described in the previous steps' figures.

The use of layer transfer in the construction of a 3D IC based system could enable heterogeneous integration wherein each strata/layer/level may include, for example, one or more of MEMS sensor, image sensor, CMOS SoC, volatile memory such as DRAM and SRAM, persistent memory, and non-volatile memory such as Flash, RRAM, FRAM, HRAM, MRAM, and OTP. Such could include adding memory control circuits, also known as peripheral circuits, on top or below a memory array. The memory strata may contain only memory cells but not control logic, thus the control logic may be included on a separate stratum. Alternatively, the memory strata may contain memory cells and simple control logic where the control logic on that stratum may include at least one of decoder, buffer memory, sense amplifier. The circuits may include the charge pumps and high voltage transistors, which could be made on a strata using silicon transistors or other transistor types (such as SiGe, Ge, CNT, etc.) using a manufacturing process line that may be, and often is, different than the low voltage control circuit manufacturing process line. The analog circuits, such as for the sense amplifiers, and other sensitive linear circuits could also be processed independently and be transferred over to the 3D fabric. Such 3D construction could include "Smart Alignment" techniques presented in this invention or incorporated references, or leverage the repeating nature of the memory array to reduce the impact of the wafer bonder misalignment on the effectiveness of the integration: such as is presented in at least PCT/US2017/052359 (WO2018/071143), incorporated herein by reference in its entirety, particularly in respect to its FIG. 11A to FIG. 12J, or using hybrid bonding techniques as presented in respect to its FIG. 20A to FIG. 25J.

More specifically, at least within PCT/US2018/016759, published as WO2018/144957, various 3D memory structures are presented including a structure named 3D NOR-P such as in respect to at least FIGS. 11A-22D, and FIGS. 27A-34C, and enhancements as presented in at least PCT/US2018/52332, published as WO 2019/060798, such as in respect to FIGS. 9A-13A, and FIGS. 14A-18, all of the foregoing is incorporated herein by reference in its entirety. Much of the following are further variations, enhancements, and detailed alternatives for such a 3D NOR-P memory structure, device and manufacturing methods.

An alternative process flow for such a 3D NOR-P structure is presented in reference to FIGS. 1A-1H. These are 3D illustrations along X-Y-Z direction 100, in which X-Y directions are along the plane of the wafer and Z direction is perpendicular to the wafer front/top surface. The 3D NOR-P structure can be hereinafter cited as 3D memory array or 3D array, interchangeably. The base structure starts with a preprocessed wafer including foundation structure 108, which sometimes is referenced as periphery under cell ("PUC") or cell over periphery ("COP"). The foundation structure 108 could include various circuits, for example, such as decoder, sense amplifier, data buffer, address buffer, interconnect matrices/structures with or without antifuses, I/O buffers, ESD, and bonding pad structures. The 3D-NOR structure may be sequentially processed on top of the base structure 108 or a 3D-NOR structure maybe fabricated separately and then bonded into the base structure later. Multilayer alternating silicon dioxide and highly doped polysilicon or alternating silicon dioxide and silicon nitride to be later replaced with metal gate are successively deposited (or epitaxially grown in some cases) forming stack pairs. The common layers are silicon dioxide 103 often called oxide and poly-silicon 105 often called poly. In some common 3D NAND structures, the successive deposition of silicon nitride (in place of poly-silicon 105) is often shortened to nitride. In the 3D NOR-P structures, just as in 3D NAND structures, the polysilicon 103 could be heavily doped such as n++-type or p++-type and could be used as the gates for the transistors of which plane formed by etching holes (often called "punch") in the multilayer structure. The holes drawn throughout this invention may be drawn circular, however, the holes are not necessarily circular, rather, for example, they can be a square, a square with its corners softened ('champhered'), or ellipsoidal or some combination thereof. The gates may also function as the Word-lines ("WL") of the 3D memory. Herein, these WLs will be drawn along the X direction, which controls one row of the arrayed in multiple column channels along the X direction. Alternatively, these WLs will be in the XY plane, which controls multiple columns and rows of the arrayed channels in the XY plane. Other orientations may be possible due to engineering design, process, economics, performance, etc. considerations.

FIG. 1A illustrates a multilayer 106 structure formed over foundation structure 108 covered with patterned hard-mask 109 after holes 102, 104 been etched through. The holes may be punched as an array with 'columns' along the X direction and 'rows' along the Y direction. A single memory cell may consist of three punched holes. The diameter of these holes 102, 104 may be the same or different. The holes 102 could be designated for the Source/Drain ("S/D") function and the holes 104 could be designated for the nano device Channel function. The space between S/D hole 102 and Channel hole 104 should be designed small enough so in the following step of indenting the polysilicon 103 layer from the hole side, the polysilicon in-between holes in the X direction would be fully removed, as is illustrated in FIG. 28A of PCT/US2018/016759 (WO2018144957). The region(s) where S/D hole 102 and Channel hole 104 merge is hereinafter referred as the neck region 107. However, the space between rows could be formed to be relatively wide so that the holes along Y direction are not merged and as the remaining polysilicon layer makes conductive along the X direction it could be used to form the Word-Lines. After such a lateral selective polysilicon etch, the formed neck region may be sharp. A process smoothing the corners of the neck region such as heat treatment may optionally be added. Within a row the holes could have a relatively narrow gap. The number of pairs in the stack could be below about 10 such as 4 or 8 layers, or below about 100 such as 32, 64, or 96 layers, or over about 100 such as 128 or 156 layers. Advanced 3D NAND products have now about 128 pairs. The diameter of the holes could be about 10 nm or about 20 nm or about 40 nm or about 60 nm or even larger.

FIG. 1B illustrates the structure after selective isotropic polysilicon 103 layer etch without removing oxide layer 105, indenting the polysilicon layers from within the holes, horizontally removing it between the S/D holes and the channel holes. While the WL could be narrowed a bit, the WLs in along X direction in between holes in the Y direction are continuous and their integrity and functionality could be kept.

FIG. 1C illustrates the structure after conformal deposition of a charge storage layer 111, which may include a combination of blocking oxide, tunneling oxide, and there between a charge trap layer or floating gate. Alternatively, instead of the charge storage layer, a ferroelectric layer such as HfZrO or HfSiO may be used as a gate dielectric and the 3D NOR structure may be operated according to the ferroelectric random access memory (FRAM) mechanism.

FIG. 1D illustrates the structure after conformal deposition of channel material such as undoped or lightly doped polysilicon, followed by a non-conformal deposition of either the same channel material or other 'dedicated' material that can seal the hole opening region 110 near the hard mask 109 without contaminating the channel material. For simplicity and clarity, the channel material hereinafter will assume to be polycrystalline silicon. When the same channel material could be used for sealing, as the channel material is being deposited, the channel material can fill the neck region, thereby separating the merged hole into three respective holes, two S/D holes 102 and one channel 104 hole. When a different 'dedicated' material and process is used for sealing, a low step coverage deposition process such as sputtering or non-conformal chemical vapor deposition (CVD) can be used to seal the structure. To maximize the non-conformality, a wafer may be tilted during deposition, often referred as glancing angle deposition. The channel material could alternatively be, for example, polycrystalline silicon-germanium, polysilicon germanium, or amorphous silicon, amorphous silicon-germanium, amorphous germanium, which could be undoped or lightly doped, for example, not exceeding a doping concentration of about $1 \times 10^{19}/\text{cm}^3$. A process to further crystallize the polysilicon channel such as laser annealing or alternative annealing step which avoids excessive dopant diffusion may be added. For example, the blocking oxide thickness could be about 3-10 nm, the charge trap layer or floating gate thickness could be about 3-8 nm, the thin tunneling oxide thickness could be about 0-5 nm, and the channel polysilicon thickness could be about 5-30 nm.

Figures 1E, 1F, 1G, 1H:
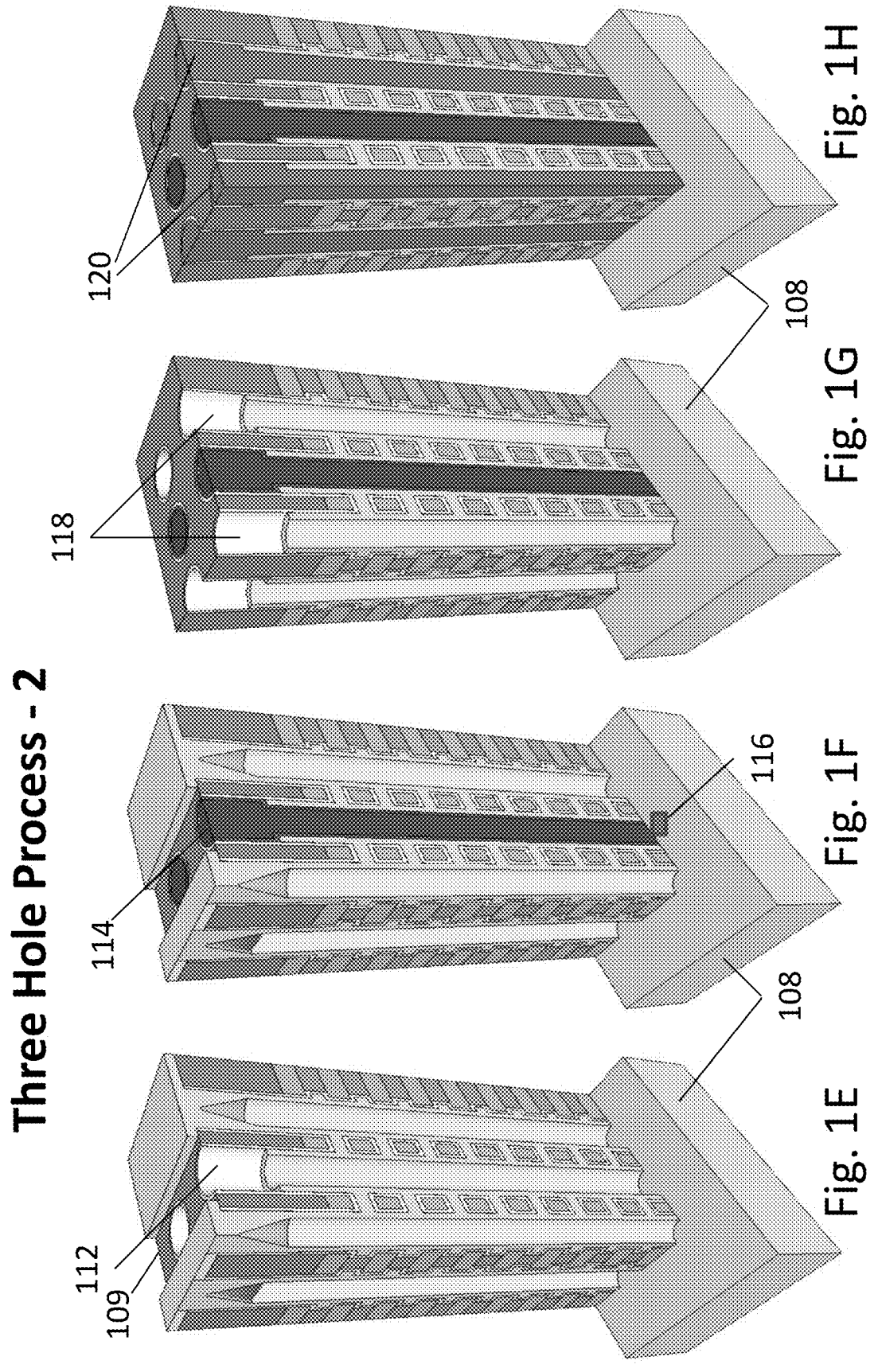

The exemplary process steps from FIG. 1E to FIG. 1G illustrate the formation of a back-gate for enhancing functionalities, for example, such as, improved retention time, write/erase speed, power efficiency, and disturb immunity. These steps may be skipped if no back-gate is desired. For example, the portion for the back-gate illustrated hereinafter may remain as a void or may be fully filled with, for example, a bulk polysilicon channel. FIG. 1E illustrates the structure after selectively opening the channel holes 112 by etching the seal region near the hard mask layer 109. During this opening process, the etching should be controlled carefully in order not to damage the channel material.

FIG. 1F illustrates the structure after filling the back-gate oxide, for example, such as silicon dioxide and the back-gate, for example, such as highly doped polysilicon or metal gate, inside the channel holes 112. If desired, the back-gate 114 oxide may be a stack of blocking oxide, tunneling oxide, and there between a charge trap layer or floating gate. Alternatively, the back-gate may be a direct body contact with no back-gate oxide. In this case, the back-gate may be heavily doped polysilicon with the same doping type as the transistor channel. Prior to the back-gate process, a process of opening a contact at the bottom of the hole 104 for the back-gate to be linked to the foundation structure 108 carrying the back-gate control circuits 116 could be included.

FIG. 1G illustrates the structure after opening the S/D holes 118, whose process is similar to the process explained with respect to FIG. 1E.

FIG. 1H illustrates the 3D NOR-P intermediate structure after filling S/D 120 with material. For example, the S/D material could form a pillar of N+ poly, or an N+ polysilicon pillar with a metal core followed by activation and silicidation, or a full metal pillar. The metal may be at least one of Ni, Ti, Co, Pt, Al, or other similar Si reactive materials. Or Si non-reactive but conductive, such as W or Ag. In one embodiment of this invention, the source and the drain are not symmetric. For example, one of the sources and one of the drains can be metal or metal silicide and the other of the source and the drain are non-metal or non-silicide material as illustrated in XY plane view FIG. 1I of FIG. 1H or a slightly modified FIG. 1H. This asymmetric S/D structure maybe desired for minimizing ambipolar transfer characteristics, which in some cases could increase the off-state leakage current. Prior to the S/D process, a process opening a contact at the bottom of each of S/D holes 102 for the S/D to be linked to the foundation structure 108 carrying the S/D control circuits could be included. Additionally, the processes sequences between S/D formation and back-gate formation could be interchangeable depending on engineering, design, and technology choices and optimizations.

Figures 1I, 1J, 1K, 1L:
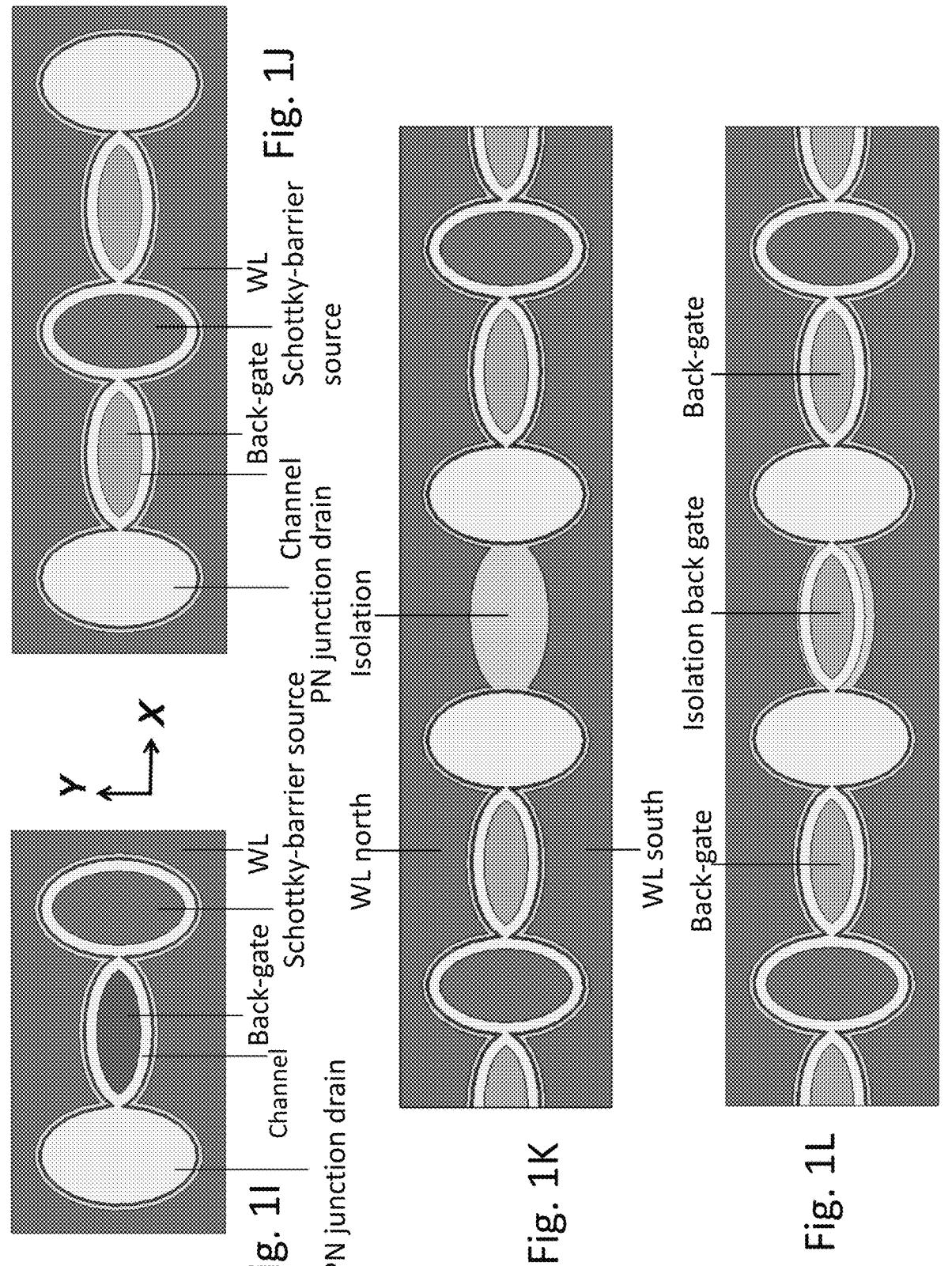
FIGS. 1I-1L are exemplary illustrations via a planar view of a 3D NOR structure.

In another embodiment, one source may be shared with at least two adjacent channels and drains as illustrated in XY plane view of FIG. 1J. In a further embodiment, the unit pillar cells along the X-direction may be electrically isolated by isolation oxide as illustrated in FIG. 1K or isolated by chaining source and drains as illustrated in FIG. 1L. By doing so, north and south sides of one channel can be independently controlled respectively by north WL and south WL. When the unit pillar cell isolation is conducted in the structure of FIG. 1L, the back-gate placed in-between adjacent unit pillars may be referred to as an 'isolation back-gate', which are dedicated to stop inter-pillar leakage current. In one embodiment of the 3D memory chip, a periphery circuit layer can be placed under or over of the 3D memory array while the interconnection lines between the periphery and the array can be made both to top and bottom of the memory array. In another alternative the periphery circuits could be on both sides under the 3D array and over the 3D array.

Figures 1M, 1N, 1O, 1P, 1Q:
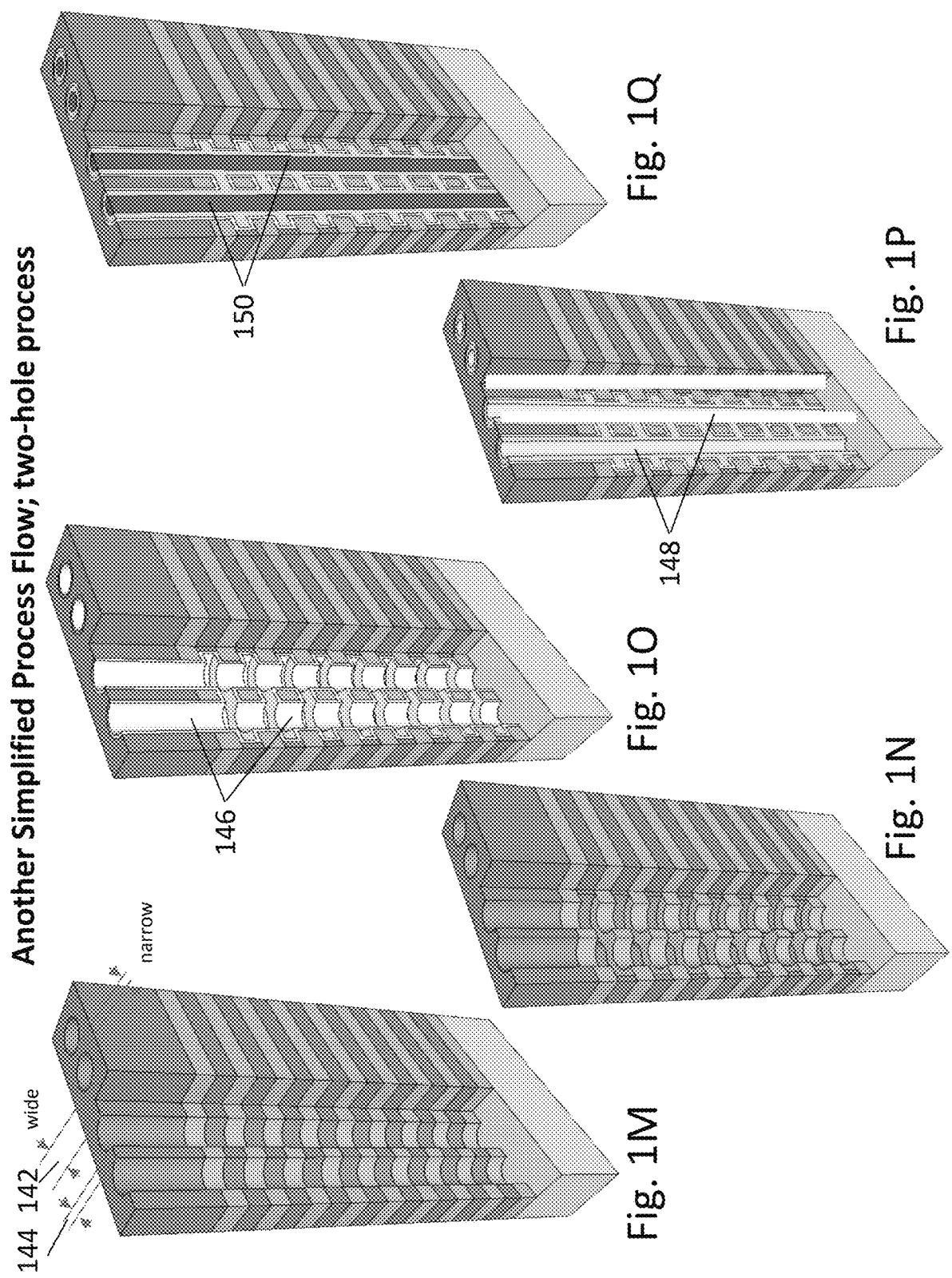
FIGS. 1M-1Q are exemplary illustrations of alternative process steps to form a 3D NOR structure.

FIGS. 1M-1Q illustrate an alternative process without dedicated punch holes for the channel pillars, both structure and process flow. FIG. 1M illustrates punch holes for a pair of Source/Drains (S/D) at a separation distance of narrower space 144 with wider space 142 the separation distance to the holes of the next pair. FIG. 1N illustrates the structure after an isotropic polysilicon etch. The isotropic polysilicon etch is used to create a horizontal indentation of the polysilicon until the polysilicon of the narrow gap 144 between the S/D pillars is fully removed but the polysilicon in the wider gap 142 between pairs of S/D remains. FIG. 1O illustrates the structure after conformal deposition of a charge trap layer stack (O/N/O) 146 or floating gate stack throughout the punch holes. FIG. 1P illustrates the structure after a conformal polysilicon deposition forms polysilicon channels 148 filling up the narrow gaps 144 in-between the S/D pairs. The holes could be designed to be wide enough so completely filling the narrow gaps 144 would not completely fill the holes, leaving room for an optional etch to widen the inner tube of the holes. As illustrated in FIG. 1Q, the S/D holes could be filled with N+ doped polysilicon, or metal, or combination of N+ doped polysilicon and metal, or their silicide as discussed previously for S/D pillars, thus S/D pillars 150 may be formed.

According to one embodiment of this invention, a process step for Metal Induced Lateral Crystallization ("MILC") of polysilicon channel could be applied in 3D NOR-P process. The MILC process is presented in at least a paper by Lee, Seok-Woon, and Seung-Ki Joo. "Low temperature poly-Si thin-film transistor fabrication by metal-induced lateral crystallization." *IEEE Electron Device Letters* 17.4 (1996): 160-162, incorporated herein by reference. In some literatures, the MILC process is also referred as metal induced recrystallization (MIC) as the recrystallization direction is not always lateral. The similar recrystallization process is applied in polysilicon channel 3D NAND structure as presented in U.S. Pat. No. 8,445,347 B2, incorporated herein by reference. A time required for MIC process in 3D NAND channel usually takes a few hours as the length of the channel is often greater than 5 µm. However, a time required for MIC process in 3D NOR-P channel can be less than one hour as the length of the channel would not be exceeding 0.2 µm. The process step for MIC in 3D NOR-P may be added in between the steps related to FIG. 1G and FIG. 1H or between FIG. 1P and FIG. 1Q. When at least one side holes designed for the source or the drain are opened, a recrystallization metal seed or nucleation promoter such as nickel, palladium, aluminum, or their combination is conformally deposited. Then, the recrystallization may be conducted by a subsequent low temperature annealing ranging from 300 to 600° C. The amorphous or small grain polysilicon channel can be converted to a large grain polysilicon channel or even single crystalline channel. The results of channel recrystallization are an increase of carrier mobility, an increase of the cell current, improvement of cell variability, tightening of the cell threshold voltage distribution, and improvement of retention time. The MILC process could be initiated from just one side of the channel to reduce the formation of boundaries associated from two crystallization waves meeting if such been initiated from both sides.

Figures 2, 3A, 3B:
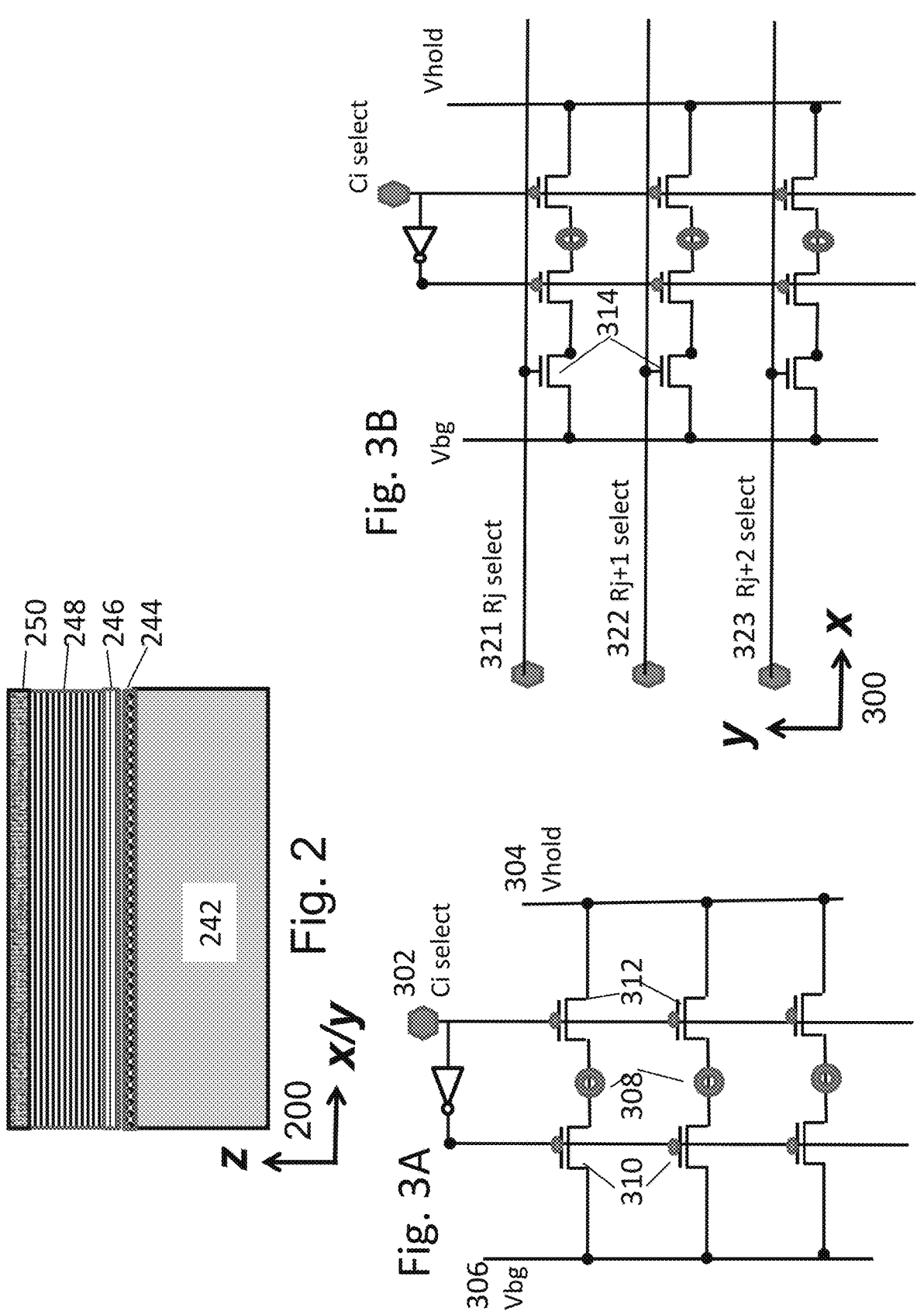
FIG. 2 is example of periphery under and periphery over a 3D NOR structure.
FIGS. 3A-3B are examples of back-gate bias control schemes.

FIG. 2 illustrates a cut view along X/Y and Z 200 direction of a section of a 3D NOR-P structure. This embodiment offers periphery sandwiching on both sides, under as well as over, the 3D memory array structure. In one example, the periphery under the cell memory control circuits 246 may control S/D and WLs while the periphery over the cell 250 may control back-gates, or vice versa, or a shared combination. A 3D NOR-P structure may include a base wafer 242, an optional 'cut-layer' 244, memory control circuits 246 disposed under the 3D NOR memory array 248, and overlaying control circuit 250. Memory control circuits 246 could be used to control the back-gate while overlaying control circuit 250 could be used to control the S/D pillars.

The formation of a multi-level 3D structure could utilize any of the techniques presented in the incorporated art such as at least PCT/US2017/052359, incorporated herein by reference, such as had been presented in reference to its FIGS. 11F-11K, FIGS. 12F-12J, or FIG. 21A to FIG. 25J. Some of levels could be integrated using Hybrid Bonding and some could be integrated using other type of bonding followed by forming the connectivity.

FIGS. 3A-3B are two exemplary circuit schematic illustrations of a section of the Back-Gate control circuit which may reside in foundation structure 108 along the X-Y 300 direction.

FIG. 3A illustrates a control per column circuit (along Y direction) in foundation structure 108 for back-bias pillars 308 of a 3D memory array. A control line, Ci or Column 'i' Select 302 allows switching a column of Back-Bias pillar or back-gate voltage (Vbg) being fed by between Holding voltage 304 using transistors 312, to access back-bias voltage 306 using transistors 310. The holding voltage is designed for extending the data retention time of the memory during standby. The holding voltage will be chosen depending on the characteristics of the memory cell. For example, when the loss of electrons in the charge trap layer of a programmed cell is due to disturb conditions or standby is stronger than the accidental injection of electrons to the charge trap layer of the erased cell, the negative holding voltage to the back-gate may suppress the electron loss because the electric field pushes the electrons toward the WL. Inversely, if the accidental charge injection to the charge trap layer of an erased cell is due to disturb conditions or standby is stronger than the loss of electrons in the written state, a positive holding voltage to the back-gate may be used. In addition, the back-gate column in which a cell is being accessed will have the back-bias voltage Vbg according to the design read or write back-bias voltage. A positive back-gate voltage may be used to remove the stored elections or erase the cell. A positive back-gate voltage but the same or smaller than the positive back-gate voltage used for the erase may be used to read the cell, which amplifies the read current and reduces the read time by a double-gating manner. A negative back-gate voltage may be used to push the electrons to be stored or program the cell. A negative back-gate voltage but the same or smaller than the negative back-gate voltage used for the programming may be used to bias all the other unselected cells, which suppresses the overall leakage current.

FIG. 3B illustrates an alternative control per column circuit in foundation structure 108 with an additional transistor 314 which allows an additional per-row control 321, 322, 323 for the selected column. The cells other than the selected row would have their back-bias floated while the one cell of the selected row (Rj Select active) would be a potential Vbg. Such an additional per row selection could help reduce the probability for read/write disturb (reading or writing of an unselected cell).

Figures 4A, 4B:
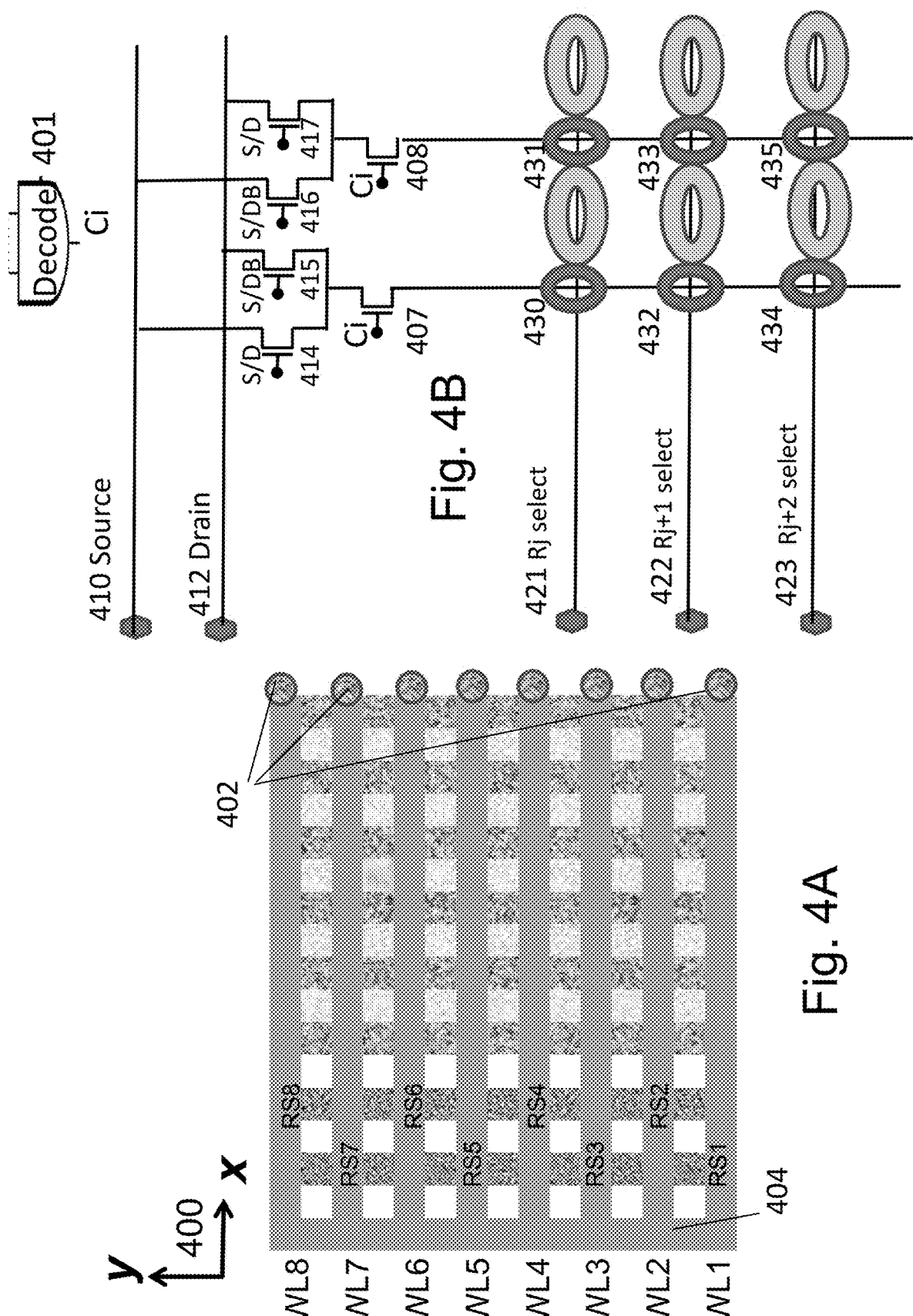
FIG. 4A is an example of a word line select structure.
FIG. 4B is an additional example of a back-gate bias control scheme.

FIG. 4A is an alternative configuration to FIG. 13A of PCT/US2018/052332 (WO 2019/060798). It illustrates an X-Y 400 cut of a 3D NOR-P structure. The Word-Lines (WL1, WL2 . . . ) between rows of memory cells are oriented in the X direction. WLs from WL1 to WL8 are one body at the edge of the 3D unit block so that they supposed to receive a common wordline voltage. Each Word-Line (WL 1-WL8) has respective per row WL select transistors RS1-RS8 (also called ridge-select) so that only selected WL through a selected RS transistor receives the wordline control voltage while remainder of the unselected WLs are floating. Optionally, on the other side a complementary structure could provide a ('weak') pull down pillar connection 402 for the unselected word-lines. At each level the word-lines have a common Y connection strip 404 to allow a Y oriented stair-case for the per-level contacts.

FIG. 4B illustrates an alternative control per column circuit in the overlaying periphery structure 250. The circuit illustration is aligned in an X-Y 400 view per one column i having an activated decoded 401 column control signal Ci. There may be two global control signals: Source signal 410 and Drain signal 412. For the activated column I one of these signals will be transferred to the left side S/D contact (430, 432, 434, . . . ) and the other will be connected to right side S/D contact (431, 433, 435, . . . ). The choice which side receives the Source 410 signal and which the Drain 412 signal is control by the logic signal S/D and its inversion S/DB using the selector circuit of the four transistors 414, 415, 416, 417. And for a Ci signal this selection would be wired through the enabling transistors 407, 408 to the two relevant S/D columns. A row selection signal Rj Select (421, 422, 423, . . . ) could be used to enable these signals to the specific selected row S/D pillars through a vertical transistor (not shown) at the top of the S/D pillars.

Embodiments of the present invention are a 3D NOR-P device and its array that sense data using voltage sensing process with a voltage sense amplifier. The voltage sensing process determines the stored memory state by pre-charging a same voltage into a selected bit line to be read and a reference bit line coupled to a reference. The reference bit line may be a fixed voltage supplied from a periphery circuit or the reference bit line may be bit line different from a selected bit line, namely an unselected bit line. The pre-charged voltage levels on the selected bit line and reference bit line asymmetrically shifts by flowing a different level of current through to the selected bit line and reference bit line depending on the threshold voltage of the programmed or erased state of the selected memory cell. The developed potential difference between the selected bit line and reference bit line is then sensed by a coupled voltage sense amplifier. When the selected cell is at the erased state or low threshold voltage state, a drive current flows through the source line and bit line of the memory cell and thus the selected voltage falls fast relative to that of the reference cell. When the selected cell is at programmed state or high threshold voltage state, a subthreshold leakage level current or no current flows through the source line and bit line of the memory cell and thus the selected voltage falls slowly or is stable relative to that of the reference cell. These allow a fast differential voltage sense amplifier to sense data and verify operation.

In one embodiment, the reference bit line can be a bit line in a paired unit or mat or bank that is associated with the unit or mat or bank being accessed. Or the reference bit line can be a bit line reserved and dedicated as the reference cells where all memory cells associated with the reference bit line are at high threshold voltage.

In a charge trapped memory transistor formed, as an example, with an n+ doped source and n+ doped drain, Fowler-Nordheim (FN) tunneling is inherently slow for DRAM replacement or even storage class applications. For example, the write speed using FN tunneling is greater than an order of few microseconds. On the other hand, the writing speed using hot carrier can offer faster speed, shorter than a microsecond, which is faster than FN tunneling. Nevertheless, the write speed near a microsecond is not applicable for DRAM applications. In order to generate hot electrons in the charge trapping memory using n+ doped source and n+ doped drain, the source is grounded and a high positive voltage is applied to the drain and the gate. At this condition, the electrons injected from the source are accelerated and become energetic near the drain junction. The majority of the electrons are swept into the drain and a fraction of the electrons, such as less than 1% of the drain current, is captured in the charge trapping site. The same acceleration mechanism with reverse voltage polarity applies to the hot-hole generation for an erasing operation. The hot-carrier mechanism consumes a high power for the programming and erasing, which limits the total number of bits that can be simultaneously written in parallel. In addition, a fundamental drawback of the charge trapping memory using n+ doped source and n+ doped drain arises in 3D memory which commonly uses a polysilicon channel for the memory cell transistor. In order for the electrons or holes to become hot or energetic, the carries needs to be accelerated, yet any scattering events retard the acceleration. As a result, whereas the hot carrier generation is feasible in a single crystalline silicon channel, the same does not occur in conventional polycrystalline silicon channel, because the electrons and holes experience phonon scattering and grain boundary scattering in polysilicon channels: for example, such as is presented in a paper by Liu, Po-Tsun, C. S. Huang, and C. W. Chen. "Nonvolatile low-temperature polycrystalline silicon thin-film-transistor memory devices with oxide-nitride-oxide stacks." *Applied physics letters* 90.18 (2007). Therefore, the lucky electron injection model is usually not applicable for a polysilicon channel. As the channel of 3D charge trapping memory, also been referred to as 3D NOR-P in this invention, is formed by chemical vapor deposition (CVD), the channel tends to be polycrystalline. As a result, the hot-carrier generation in 3D charge trapping memory could be very difficult.

In order to solve the challenge associated with a polysilicon channel of hot-carrier generation in the 3D charge trapping memory, also been referred to as 3D NOR-P, presented in this invention and in the incorporated by reference patents and applications, a metal source and metal drain is presented, also been referenced to forming a Schottky barrier between Source or Drain and the channel. Unlike the conventional needs for the carrier to be accelerated traveling through channel from source for hot-carrier generation, for sources formed by metal-single crystalline silicon channel as well as metal-polycrystalline silicon channel, forms abrupt energy band banding in the Schottky junction. Thus, the carrier could be accelerated without the need to travel the channel. As a result, the hot-carrier is generated near the source side in a Schottky junction unlike the common case of single crystal pn junction in which the hot carriers are generated near the drain. Such mechanisms are discussed in many of the art presented in the related applications and patents incorporated by reference in here such as in papers by Shih, Chun-Hsing, et al. "Schottky barrier silicon nanowire SONOS memory with ultralow programming and erasing voltages." IEEE Electron Device Letters 32.11 (2011): by Shih, Chun-Hsing, et al., "Schottky barrier silicon nanowire SONOS memory with ultralow programming and erasing voltages." *IEEE Electron Device Letters* 32.11 (2011): 1477-1479; by Ho, Ching-Yuan, Yaw-Jen Chang, and Y. L. Chiou. "Enhancement of programming speed on gate-all-around poly-silicon nanowire nonvolatile memory using self-aligned NiSi Schottky barrier source/drain." *Journal of Applied Physics* 114.5 (2013): 054503; and by Chang, Wei, et al., "A localized two-bit/cell nanowire SONOS memory using Schottky barrier source-side injected programming." *IEEE Transactions on Nanotechnology* 12.5 (2013): 760-765, all of the foregoing in their entireties are incorporated by reference herein.

In addition to the hot-carrier generation in polysilicon channel, there is also important advantages in Schottky-junction based charge trapping memory (3D NOR-P). As explained earlier, in conventional channel hot carrier injection, different voltages need to be applied to the source and drain in order to create a flow of current through the channel and accelerate the carriers. Only a very small fraction of carriers are being used for the charge storage, thus wasting more than 90% of the power. In the charge trapping memory using Schottky barrier, the same voltage can be applied to the source and the drain so that no current flows across the source and the drain. Rather, the injected current from any or both sides of the source or drain tends to be captured in the change trapping layer because the electrical potential is formed for the carrier favorable to move toward the gate or wordline. This fact implies the writing and erasing can not only be fast but also consumes a much smaller writing power compared to the conventional pn junction. In fact, not only the conventional charge trapping memory using hot-carrier programming but also many of emerging memories such as MRAM, RRAM, and PRAM are constrained in parallel writing due to high write power. Therefore, such a constraint limits their use for wide bus width application, limiting massive parallelism. The Schottky junction charge trapping 3D memory (3D NOR-P) presented here and in the related applications and patents incorporated by reference herein could consume orders of magnitude lower write power, thus enabling wide bus width applications. The page size represents essentially the number of bits per row. The page size is the number of bits loaded into or written back from the sense amplifier when a row is activated. The page size of the Schottky junction charge trapping 3D memory (3D NOR-P) can be greater than 2 KB or 4 KB, or even greater than 16 KB. When the wide page size application is enabled, the clock frequency or timing parameters such as Row Address to Column Address Delay and Column Access Strobe—"CAS" latency can be relaxed, which can further reduce the power consumption. The wide bus width with relaxed timing parameter is particularly beneficial for mobile applications such as, for example, smartphones or tablets.

Figures 5A, 5B, 5C:
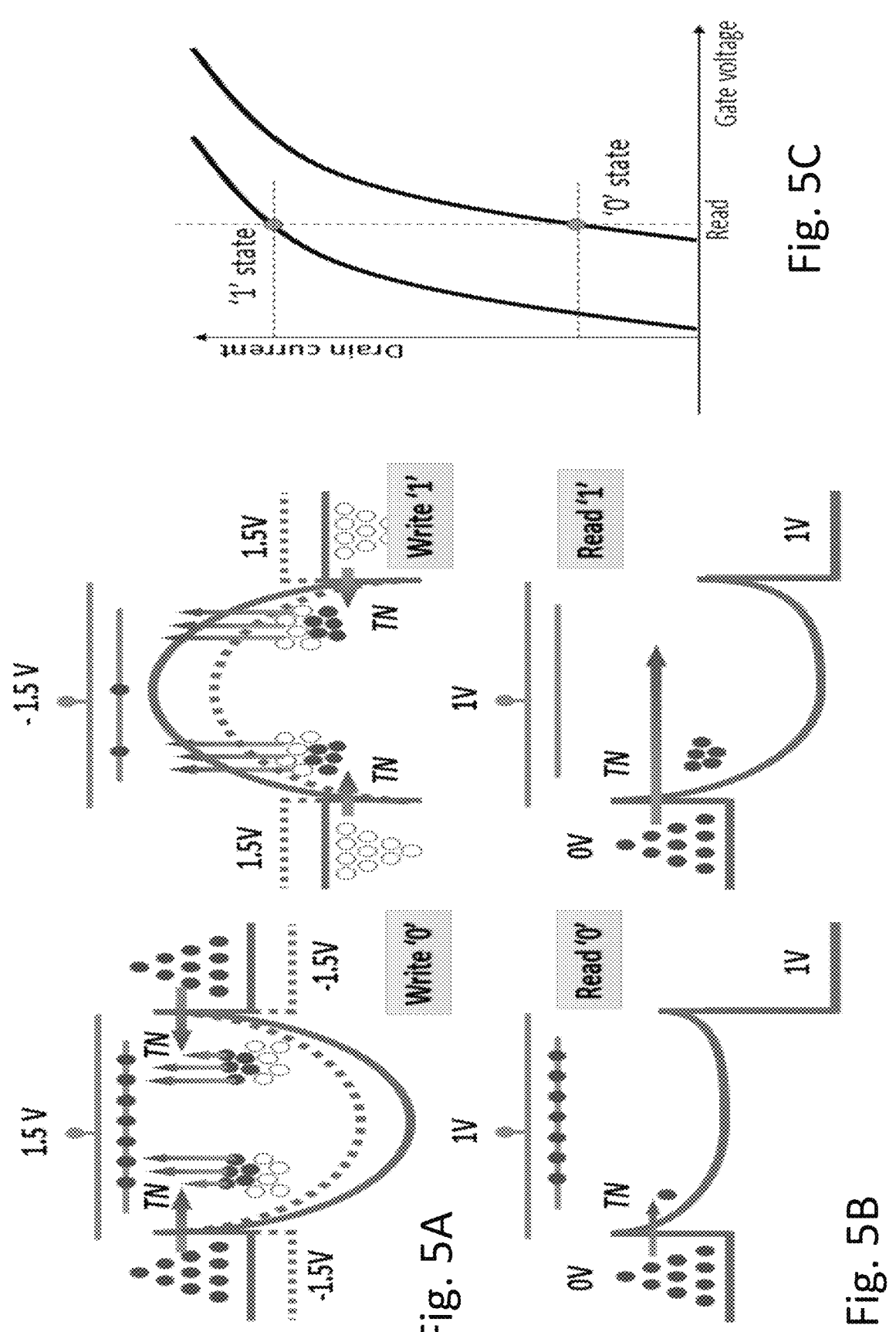
FIGS. 5A and 5B are exemplary illustrations of a memory cell write and read operation scheme.
FIG. 5C is an exemplary illustration of a programmed and erased memory cell Id-Vg characteristics.

A 3D NOR-P memory using a Schottky junction and polycrystalline channel operation scheme is shown in FIG. 5A-5C. The dotted line in the FIG. 5A represent the energy band diagram for WL=BL=SL=0V. As is illustrated in FIG. 5A, for write '1', −1.5 V is applied to WL and 1.5 V is applied to SL/BL. The hot holes are injected from the Schottky junction and trapped into the charge trapping layer. In some cases, particularly wherein the Fermi level of the metal is pinned close to the conduction band of silicon, the trapped electrons are detrapped by FN tunneling. The trapped holes or removal of the trapped electrons decrease the threshold voltage. For a write '0', 1.5 V is applied to the WL and −1.5 V is applied to the SL/BL. The hot electrons are injected from the Schottky junction and trapped into the charge trapping layer. The trapped electrons increase the threshold voltage. In order to use WL=0V for the shut-off voltage to unselected rows, the target threshold voltage of state '1' is slightly greater, but not limited to, than 0V such as 0.2V~0.4V. For the unselected device, WL/SL/BL are grounded. For the half-selected cells, the voltage difference from WL to SL or WL to BL is 1.5 V, which could be a condition to be too small for Schottky junction tunneling. Therefore, the programming could be inhibited. As is illustrated in FIG. 5B-C, for read, the WL voltage of 1 V is applied so that the current difference due to threshold voltage difference can be sensed. The unselected WL is grounded so that minimal BL current flows regardless of the memory states. In order to use WL=1V for the read voltage to the selected row, the threshold voltage of the state '0' would be slightly greater, but not limited to, than 1 V such as 1.2V~1.4V.

Figure 5D:
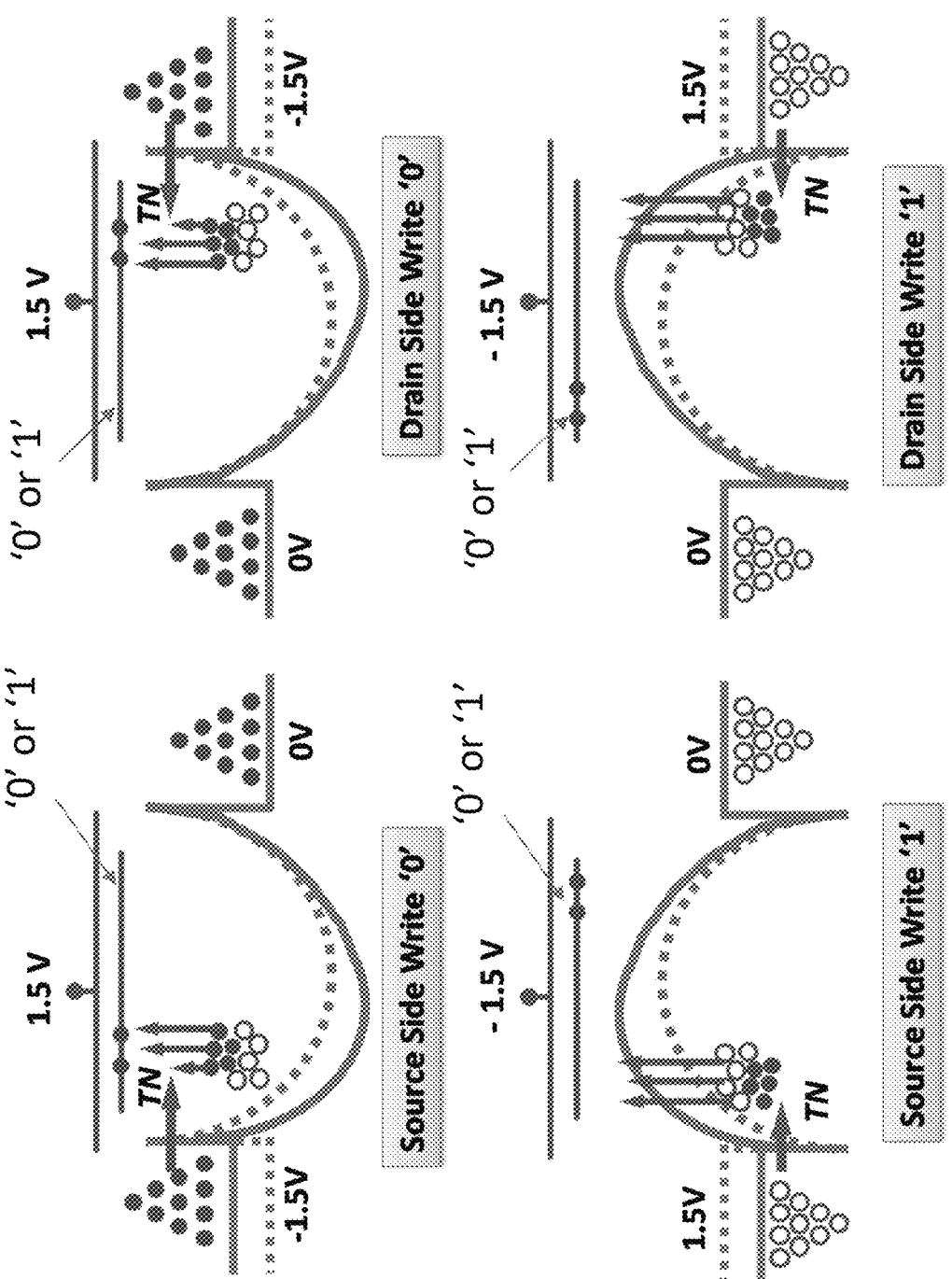
FIG. 5D is an exemplary illustration of a write scheme for mirror-bit operation of a memory cell.
Figure 5E:
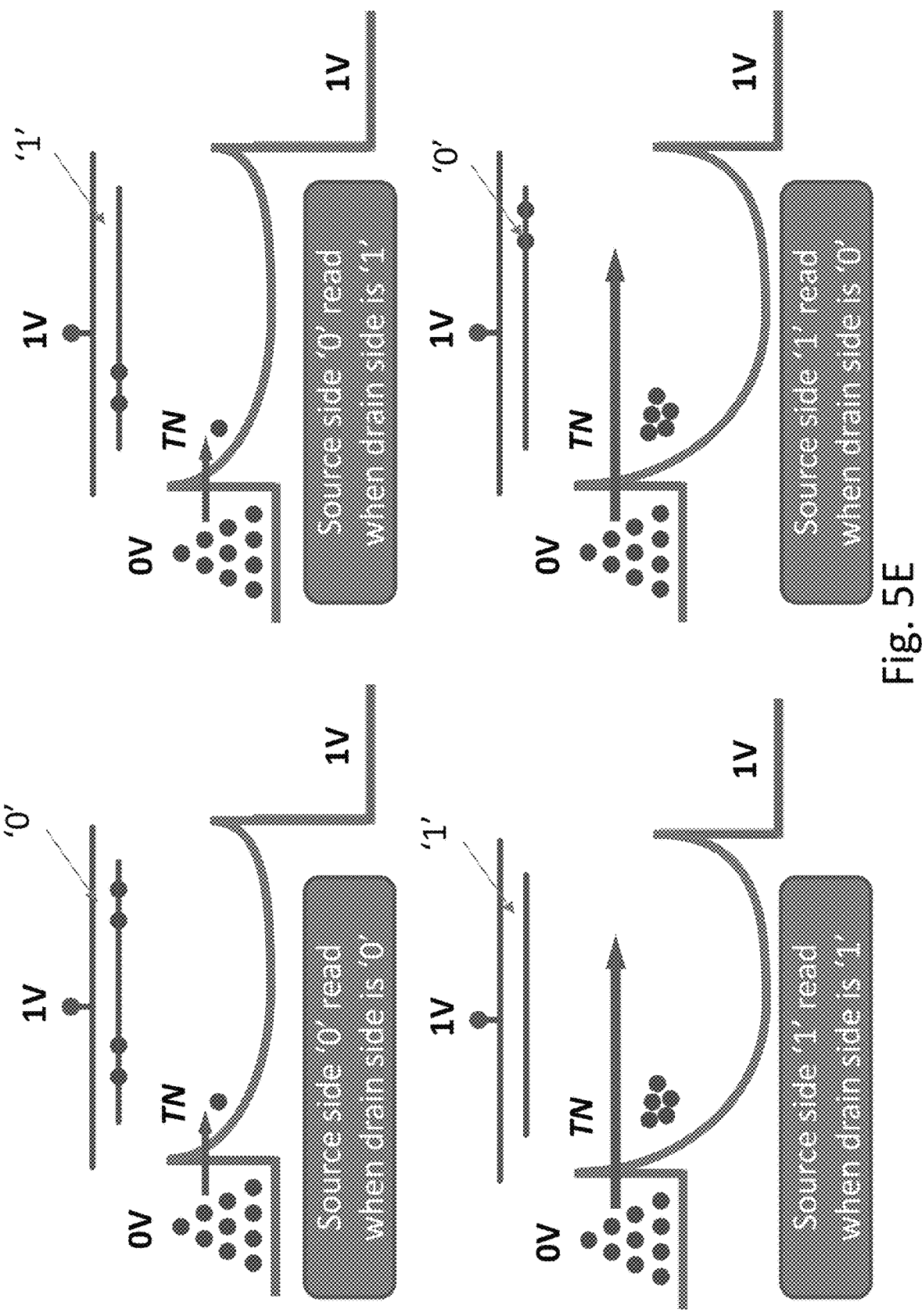
FIG. 5E is an exemplary illustration of a read scheme for mirror-bit operation of a memory cell.

As presented in the incorporated by reference art and related patents and application, alternative writing schemes could also be used. Different writing condition for 3D NOR-P type memory having Schottky Barrier is used to drive current through the channel to program or erase only close to the source-side or drain-side or both sides of Schottky junction. This allows two memory zones per channel, one near the source and another near the drain, as also known as a mirror-bit scheme. Such has been presented in reference to FIG. 17, FIG. 19, FIG. 21 and FIG. 23 of U.S. Pat. No. 10,014,318, incorporated by reference, and FIG. 13A-13D of patent application Ser. No. 16/337,665 (published as US 2019/0244933), incorporated by reference in its entirety. In some of the patents or applications incorporated by reference the reference to such 3D memory included similar terms to, such as, 3D charge trapping memory, 3D NOR, 3D NOR-P, 3D NOR-C. The unique advantages relating to the use of a metalized Source having a Schottky Barrier is relevant to all of these structure and perhaps far more so, for those techniques and structures utilize a poly-silicon channel. The mirror-bit operation scheme in the 3D NOR-P memory using Schottky junctions and a polycrys-talline channel operation scheme is shown in FIG. 5D-5E. The dotted line in the FIG. 5D represents the energy band diagram for WL=BL=SL=0V. As is illustrated in FIG. 5D, for write '1' into the source side, −1.5 V is applied to the WL, 1.5 V is applied to the SL, and 0V is applied to the BL (drain side). The hot holes are injected from only the source side's Schottky junction and are trapped into the charge trapping layer near the source whereas no significant hole injection takes place in the drain side's Schottky junction. Similarly, for write '1' into the drain side, −1.5 V is applied to the WL, O V is applied to the SL, and 1.5 V is applied to the BL (DL). The hot holes are injected from only the drain side's Schottky junction and trapped into the charge trapping layer near the drain whereas no significant hole injection takes place in the source side's Schottky junction. For write '0' into the source side, 1.5 V is applied to the WL, −1.5 V is applied to the SL, and 0V is applied to the BL (DL). The hot electrons are injected from only the source side's Schottky junction, whereas no significant electron injection takes place in the drain side's Schottky junction. Similarly, for write C into the drain side, 1.5 V is applied to the WL, 0 V is applied to the SL, and −1.5 V is applied to the BL (DL). The hot electrons are injected from only the drain side's Schottky junction, whereas no electron injection takes place in the source side's Schottky junction. When the write '0' or write '1' operation is made on one side of junction, the memory state of the opposite side does not affect its writing operation. In order to reduce disturb the memory state of one side against another side, the channel length of the memory transistor could be made greater than 100 nm. In this case, particularly the Fermi level of the metal is pinned close to the conduction band of silicon, the trapped electrons are detrapped by FN tunneling instead of hot hole injection. In this case, the block erase rather than bit-specific erase would be favored FIG. 5E illustrates the read operation for a source side read. In order to read the source side's memory state, the SL is grounded and a read voltage is applied to the BL (DL) and vice versa. The drain side read is not drawn but it is the reciprocal by swapping SL and BL (DL) voltages. For read, a voltage such as 1V is applied to the WL for both a source side as well as a drain side read. Other but different voltages are applied to the SL and BL (DL), and the current is measured to detect the threshold voltage associated with the charge trapping element. For example, SL=0V and BL=1V (DL=1V) is applied to sense the source side's storage state and SL=1V and BL=0V (DL=0V) is applied to sense the drain side's storage state. The threshold voltage is domi-nated by the charge trapped state near the ground node and the charge trapped states ('0' or '1') near the read voltage biased node is masked as illustrated in energy band diagram in FIG. 5E.

It should be noted that the use of 1V, 1.5V, −1.5V in FIG. 5A-5E and the related description are just an examples and the specific voltages use in specific devices are highly related to the specific device structure and could be varied accordingly. An example of other operating voltages for Schottky Barrier based charge trap devices with polysilicon channel is presented in at least a paper by Chang, Wei, et al., "Drain-induced Schottky barrier source-side hot carriers and its application to program local bits of nanowire charge-trapping memories." *Japanese Journal of Applied Physics* 53.9 (2014): 094001, incorporated herein by reference in its entirety, illustrating these two writing modes in respect to its FIG. 4. While there could be many design considerations choosing device structure, operating method, and voltages, there is one aspect relating to the relatively low program-ming voltages presented in reference to FIGS. 5A-5E. A relatively low programming voltage could be used to form a relatively low threshold voltage shift, such as 1 volt, which could help overcome the ambipolarity of some Schottky barrier based devices. Such was presented also in PCT/US2018/016759, incorporated herein by reference, in refer-ence to at least its FIG. 12A-12D.

Furthermore, in some devices the memory control cir-cuits, such as 250 and 246, could include additional circuits such as controllers and sensors such as temperature sensors to support modifying these bias voltages. Such on the fly environmentally driven signal level modifications are com-mon in memory devices and could be designed/adapted to compensate for various issues, including short time adaption and long term adaption. Such control could be used for many of the device operations including also changing the rate of refresh and other operation such as relate to at least FIGS. 6A-6G herein.

Figure 6B:
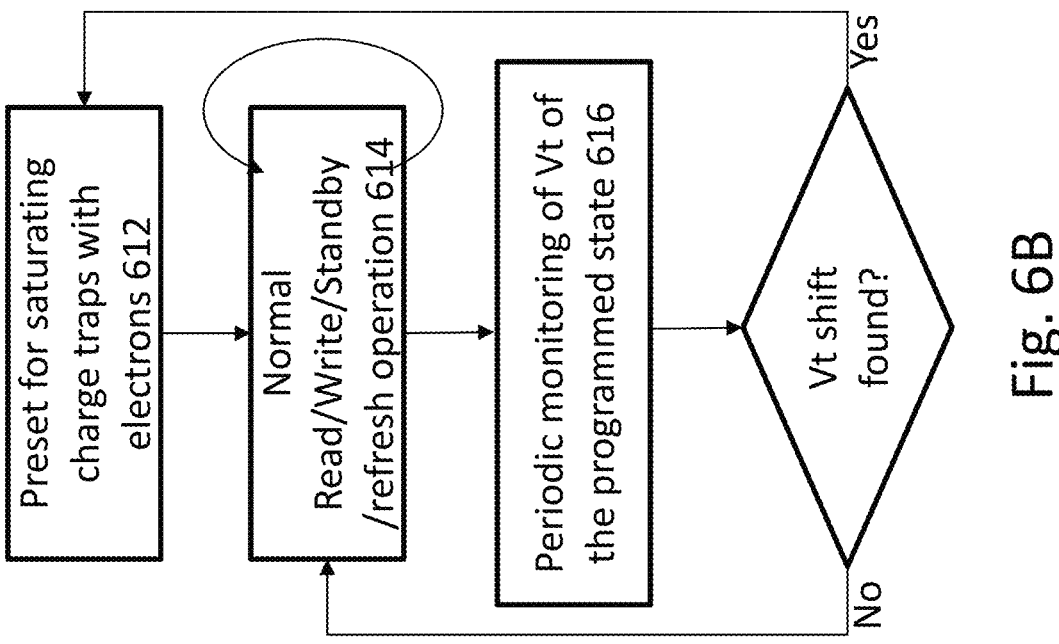
FIG. 6B is an exemplary illustration of an operational method for a charge trap memory.
Figure 6A:
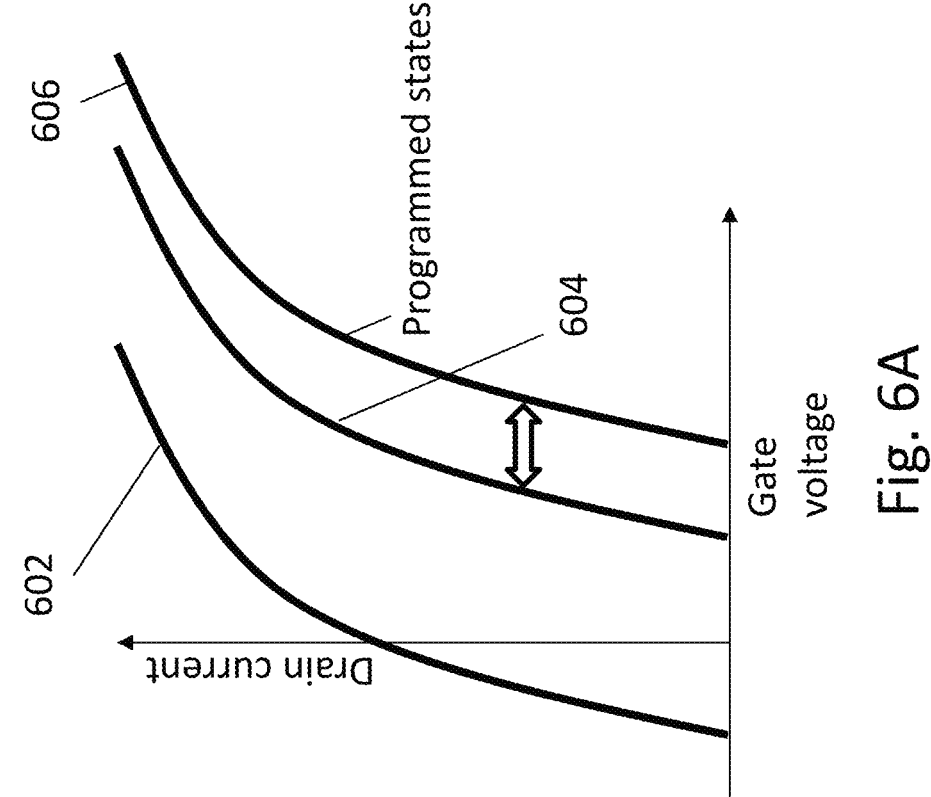
FIG. 6A is an exemplary illustration of a transfer curve of a charge trap memory cell.

FIG. 6A illustrates a transfer curve or drain current versus gate voltage characteristic of a charge trap memory cell. The threshold voltage transfer curve of the as-fabricated device 602 is determined by the native trap states. For the as-fabricated states, the threshold voltage is usually lower because the traps are mostly empty. Each trap that is capable of storing an electron has its own location and energy state. Some traps are located far from the channel and close to the blocking oxide but other traps are located far from the blocking oxide and close to the channel. Apart from its physical location, some traps have deep energy states but other traps have shallow energy states. Depending on its location and energy depth, the voltage and time required to store and remove electrons to these traps varies. For example, a higher voltage and/or longer pulse width may be required to fill/empty the traps close to the blocking oxide and the traps with deep energy states. However, a lower voltage and/or shorter pulse width may be required to fill/empty the traps close to the channel interface and the traps with shallow energy states. In this case, the deep energy state trap is often called a slow trap while the shallow energy state trap is often called a fast trap. During the formation of the charge trap layer, trap energy distribution is very random so it is almost impossible to exclusively fabricate a device with just fast traps. Accordingly an operational method could be adapted to nullify the effect of the slow traps. The method is illustrated as a flow chart in FIG. 6B. First, the charges traps with all energy states are fully saturated before normal operations such as read, write, hold, and refresh. This operation may be called the preset mode. The preset operation can be accomplished without a memory controller. For example, when the system power is turned on, the memory internal periphery circuit can conduct the preset operation during the calibration period. Alternatively, the preset operation can be conducted by order of memory controller. The preset can be conducted only once for its first use. Alternatively, the preset can be respectively conducted as for its functional maintenance. The preset mode would be similar to the program operation of the memory but with a higher word-line voltage and/or longer program pulse width. The preset mode is activated as initiation process 612 such as when the memory is booted. Then, during normal operation 614, the device controller uses write and erase voltages that are limited so not to disturb or remove those trapped electrons in the deep energy states. As a result, the transfer curve for the programmed state 606 would be similar to the transfer curve after the preset operation. For the erased state, the threshold voltage is lowered but not fully lowered 604. The amount of the threshold voltage shift ("Vt") therefore between the programmed state 606 and erased state 604 is determined by the amount of the shallow trap density. By nullifying the involvement of the deep traps, the charge trap memory may work at a higher speed. Assuming that the Vt for the cell with fully emptied charge trapped state is Vt,min and the Vt for the cell with saturated filled charge trapped state is Vt,max, only part of Vt window is used in this method of memory operation. The maximum capable Vt window is $\Delta Vt,max=Vt,max-Vt,min$, Vt of memory state '0'/programmed state could be similar to Vt,max but Vt of memory state '1'/erase state could be Vt,max$-$q Vt,max, where a could be 0.05, 0.1 or 0.2. In other words, the programmed cell ('0') could be in a fully filled charge state and the erased state ('1') could be a partially emptied charge state which may be achieved by preferentially eliminating shallow trap level electrons. If required 616, the threshold voltage shift from the fully saturated state or programmed state could be monitored, and a preset mode could be intermittently triggered. Such a partial erase could be achieved by shortening the time of the erase operation by 50% or 80% or even more than 90%. So, for example, if for a specific memory structure the erase and full removal of the charge trapped could take more than a microsecond (μs), the partial erase could be performed in less than 0.5 μs or less than 0.1 μs or even less than 30 ns.

The concept presented with respect to FIGS. 6A-6B could also be used to improve other types of memory such as Ferroelectric ("FE") memories. Ferroelectric memory such as presented in respect to FIG. 24A-FIG. 26H of PCT/US2018/016759, incorporated herein by reference, are attractive as a high speed memory but considered to have a limited endurance of about 106. An undesired charge trapping at the gate stack is a significant factor in the limiting of the memory endurance. The concept of shifting the memory threshold could help in nullifying the effect of this undesired charge trapping. This charge trapping is a very slow process and once charge has been trapped it will stay trapped for long time. Accordingly the memory block could be tested by the memory controller and the memory threshold could then be adjusted.

This concept could be further illustrated in respect to FIGS. 6C-6E. FIG. 6C illustrates charge trapping operation, i.e., threshold voltage shift for the charge traps from the empty state to an electron saturated state. As programming time increases, the threshold (Vt) shift grows as more electrons get trapped. Early on, the low energy trapping locations get filled up first and then the higher energy trapping locations are also filled up with electrons as the programming operation continues. Therefore, the programming rate is high in the early stages and the programming rate becomes lower as the trapping sites become saturated. A key aspect is a charge trapping structure that could be at a fully saturated threshold voltage within a reasonable Vt distribution. Such could be achieved by limiting the charge trapping layer volume by limiting the charge trapping layer thickness and developing a uniform quality nitride layer process having uniform trap density and trap energy distribution across chip area. Accordingly, the 3D memory could be structure with charge trapping layer thickness of less than 2 nm or 3 nm or 5 nm or 7 nm. The charge trap layer trapping capacity is highly dependent on its volume/thickness and the level of trapping sites in it which depend on layer material composition and formation process. Furthermore, the film integrity of the blocking oxide could be dense having inherently minimal trap density. The inverse would happen during an erase operation as is presented in FIG. 6D. Early on the low energy trapping sites get erased which is indicated by the fast reduction of the Vt shift because the charges trapped in the shallow level are favorably removed than those in the deep level. Then as the erase operation continues the electrons at the high energy trapping sites also get moved out, and if the erase operation continues some holes get trapped resulting in an "over-erased" state. In general, the programming rate is higher than the erasing rate. In order to obtain a balance between the program speed and the erase speed, the memory state threshold voltage window is partially utilized by maximizing the erase speed but compromising the programming speed as illustrated in FIG. 6E. First, the initialization process is necessary to fully saturate the threshold voltage shift by storing electrons in the charge trapping sites. This process may take long enough such that substantially all of the trap sites get programmed with electrons. Then the normal program and erase operation can follow. For the programmed state, the charge traps are fully filled with electrons. For the erased state, only charge traps with low trapping energies are selectively removed. The pulse width for the programming and erasing may be set to be the same. The programming pulse width is set to saturate the charge traps.

There might be the die to die or wafer to wafer variability in terms of its saturation Vt. In order to address those variability, the memory peripheral circuit may include built-in self-test (BIST). The BIST tests the program and erase voltage to meet a required programming and erasing timing parameters and reflect them into a programmable structure such as programmable resistors, anti-fuses, etc. Accordingly, a slightly different program, read, erase voltages could be used per every memory sub-array basis or memory bank basis. In addition, if the BIST results shows that some cells do not meet the required timing parameters, the memory structure could include redundancy so WL which include defective cells could be disabled and replaced with a WL for the redundant cells. Such a test is often called post-package-repair (PPR). In addition, the energy level and density of trapping sites could also change over time and accordingly over time the method suggested herein in respect to FIG. 6A-6D could include periodic adjustments to track device changes over time. Such could be at relatively high rate of hours in some applications, days in other applications or even months.

Figure 6F:
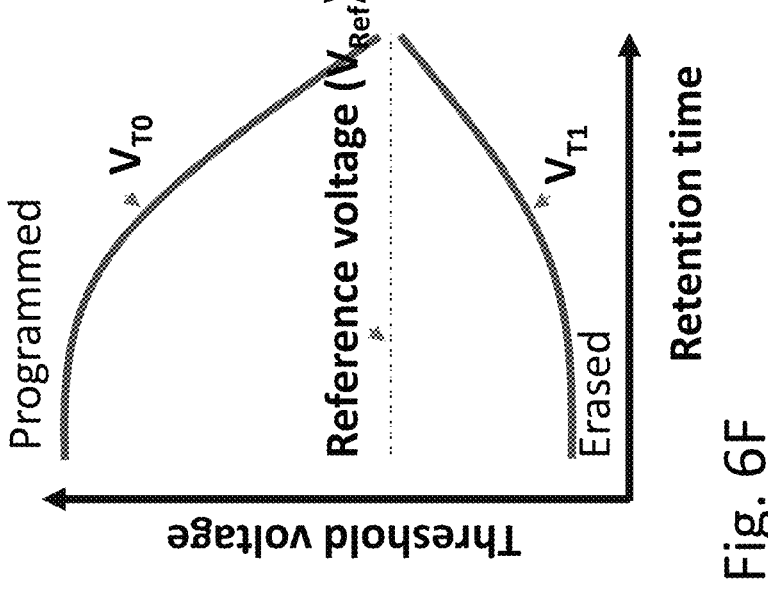
FIGS. 6F and 6G are exemplary illustrations of a pre-saturation mode charge trap memory threshold detection delta V.
Figure 6G:
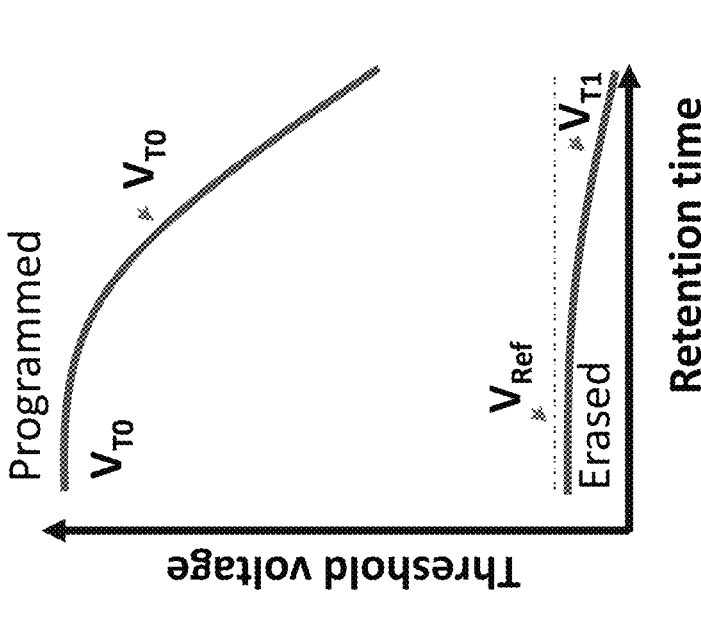

An additional benefit from the techniques presented here in reference to FIG. 6A-6E, called "Pre-Charging," relates to the memory retention time. FIG. 6F illustrates a conventional flash memory retention time chart that uses fully filled charge traps and fully emptied charge traps. The charge of the programmed cells is leaking out causing the threshold voltage associated with programmed cells $V_{T0}$ to move down, while the erased cell accumulates charge and their respective threshold voltage is moving $V_{T1}$ up, closing the memory window from both sides. Therefore, the reference voltage is set to very middle of $V_{T0}$ and $V_{T1}$. FIG. 6G illustrates the retention characteristics time chart for flash cells using Pre-Charging. It illustrates that, in this case, the threshold voltage for both $V_{T0}$ as well as $V_{T1}$ are moving down over time, because the data retention mechanism is electrons leaking for both programmed and erased states. Therefore, the reference voltage can be set to between $V_{T0}$ and $V_{T1}$ but much closed to $V_{T1}$. Accordingly, the Pre-Charging technique helps by extending retention time.

Such leakage is also a drawback, which could be overcome by the device controller periodically performing a self-test and 'refreshing' the pre-charging. Such a maintenance mode could utilize the idle time of the memory to avoid interfering with the device normal operation.

Figure 7B:
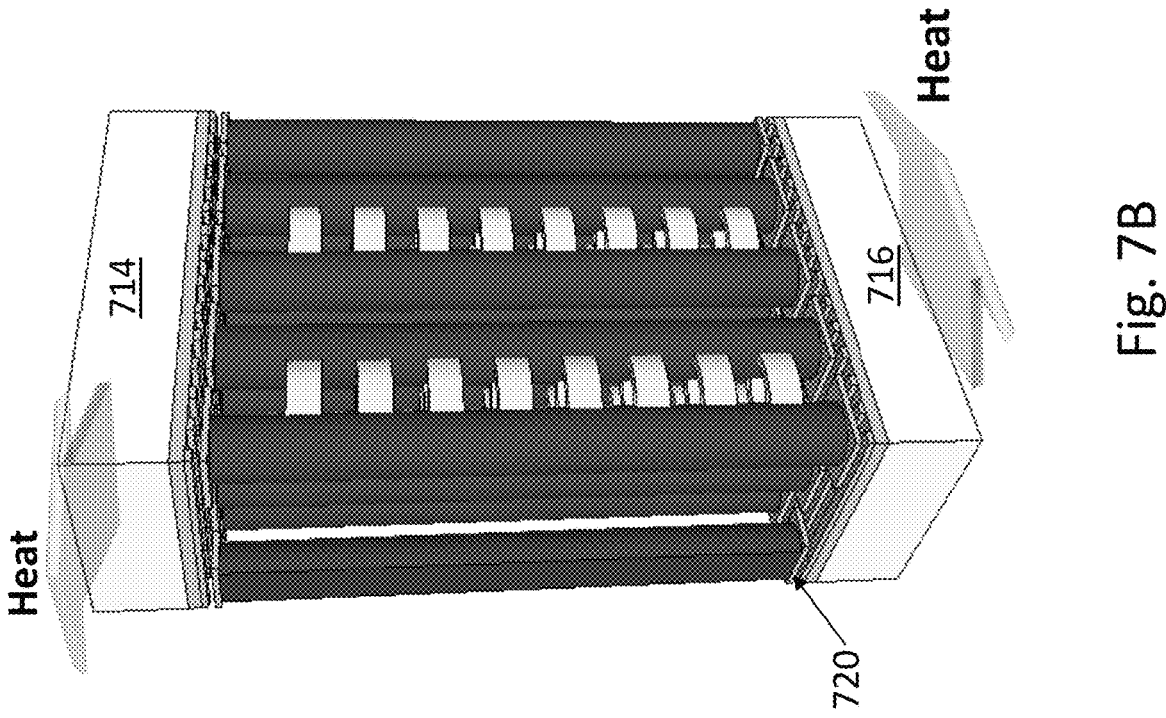
FIGS. 7A and 7B are exemplary illustrations of some of the advantages of metallic bit lines in a 3D NOR-P structure and device.
Figure 7A:
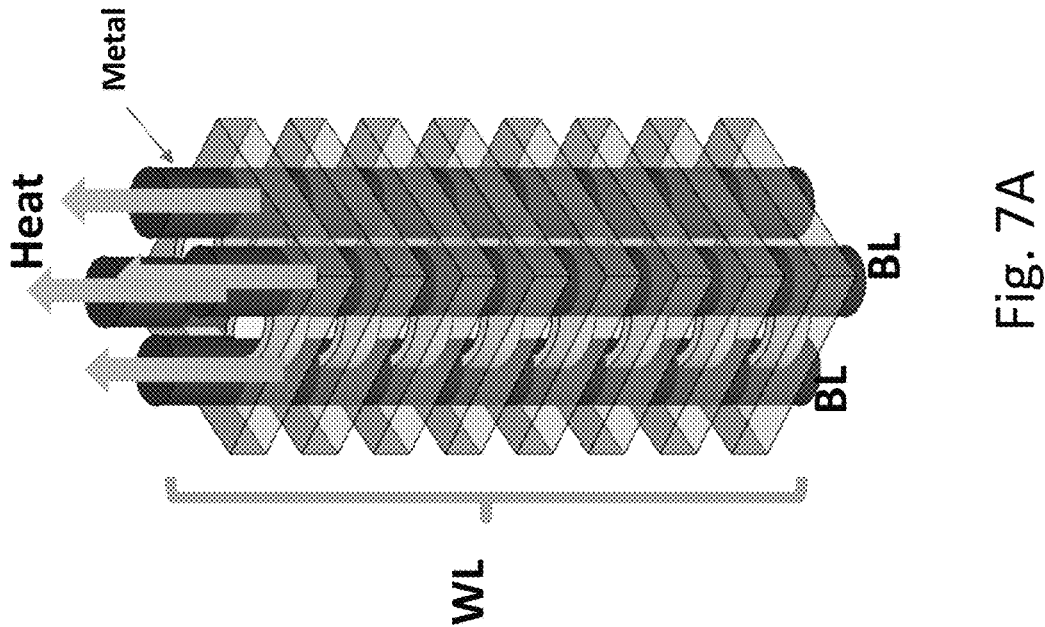

FIG. 7A illustrates an advantage for use of metallic bit lines (S/D). In general, the metal has a good thermal conductivity in comparison to all the other materials present in such a device. Therefore, these metallic pillars could help remove the heat from the inside of the 3D memory structure to the top or the bottom surface of the memory structure. The heat could be then conducted out to the device top surface or bottom surface. The device cooling then could affect the entire memory structure. It should be noted that conducting out the heat could be done without forming any leakage between these pillars. Such heat conductive techniques which do not form an electrically conductive path are known to artisans in the art and presented in some of the art incorporated herein by reference in the cases discussing heat removal: for example, at least U.S. Pat. Nos. 9,023,688 and 9,385,058.

FIG. 7B illustrates a portion of the device with top silicon substrate 714, and bottom silicon substrate 716. The device could comprise a thermal path, not shown, from the S/D pillars to these substrates 714, 716 without forming electrical path using techniques such as been presented in the incorporated by reference art. Landing pads 720 could include those types of structures which conduct heat but not electricity. The substrates could have good heat conduction. And from the substrate, the heat could be removed using techniques well known in the semiconductor industry.

The heat mobility through the metalized source or drain pillars as illustrated in FIG. 7A, could also be utilized in the other direction to bring heat into the channel to help initiate channel recrystallization as has been detailed herein with respect to Metal Induced Lateral Crystallization ("MILC") of the polysilicon channel.

The 3D NOR-P as presented herein could be used for high capacity DRAM applications. Artificial Intelligent ("AI") using Deep Neural Networks ("DNN") are becoming the driver of electronics systems and accordingly a growing part of the DRAM devices are use for these application. In such systems the majority of the memory access is for reads and less than 30% of the memory access is from writes. Such use cases work well with the 3D NOR-P technology presented herein. Yet while for conventional DRAM a group of memory bits could be accessed in parallel by having all of them controlled with the same wordline for read and for write, for 3D NOR-P the wordline voltage for write '1' (programming) is very different than for write '0' (erase). Accordingly the memory control needs to be different than in a DRAM. 3D NOR-P memory control could use two cycles: one for the bits that are to be programmed and one for the bits that need to be erased. Another alternative is to leverage the fine granularity of the 3D memory structure illustrated in FIG. 2 herein and FIG. 6 of PCT/US2018/52332. Accordingly the parallel access could be made to bits that do not share the same wordline. In such an access scheme, the memory control circuits could set the proper conditions independently to each of the memory cells being accessed. An artisan in the memory art can designed the detailed circuit for such a memory.

Figure 8:
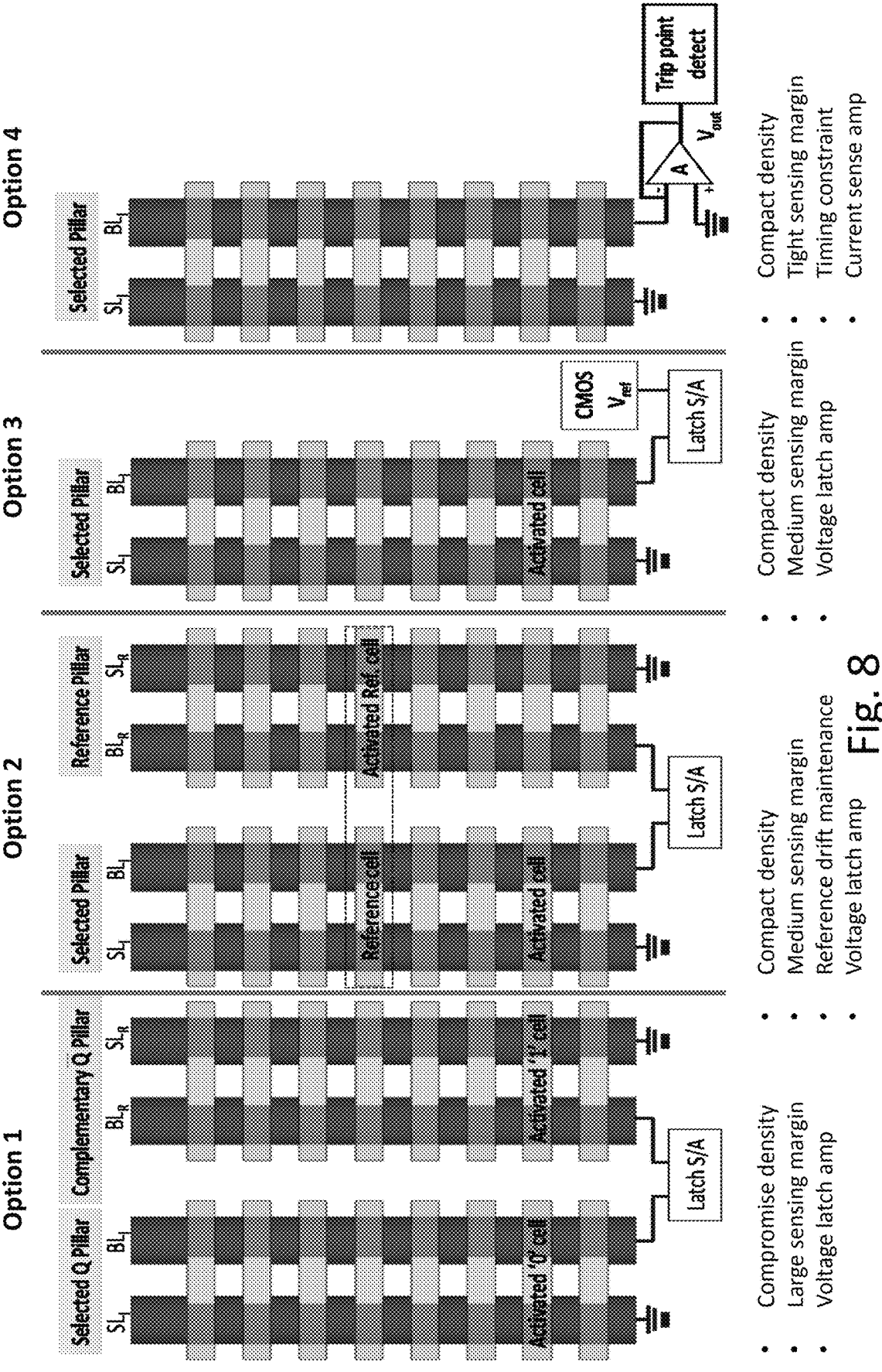
FIG. 8 is an exemplary illustration of various options for reading a 3D NOR-P device or structure.

FIG. 8 illustrates various options for reading a 3D NOR-P device or structure. Option 1 utilizes the differential mode memory scheme. In order to store one bit, two physical memory transistors are used wherein complementary bits are in each memory cell. One memory pillar structure has a complementary memory pillar structure that stores the complementary data. The memory pillar and complimentary memory pillar may be located within the same or different memory tiles or blocks. The same WL voltage for read is applied to both the selected WL and the complementary WL. The read operation can be accomplished by using a voltage latch sense amplifier, similar to the sensing for the double ended SRAM.

Option 2 utilizes memory transistors in a fixed layer in a pillar as dedicated reference transistors. The threshold voltages of the reference memory transistors are managed and maintained to the reference threshold voltage explained in FIG. 6G. The memory pillar for the reading and the reference pillar are located at different memory tiles or blocks. Therefore, only the WL voltage for read is applied to the selected WL layer but no WL voltage is applied to the same level of the reference pillar. During read, the reference WL voltage is applied to the reference WL layer of the reference pillar. The read operation can be accomplished by using a voltage latch sense amplifier, similar to the sensing for the double ended SRAM.

In option 3, the reference voltage may be synthesized by using CMOS logic transistors and used as a reference voltage. The read operation can be accomplished by using a voltage latch sense amplifier, similar to the sensing for the double ended SRAM.

In option 4, a current sensing method may be used to read, which uses the difference in current level for the difference in memory state. The current amplifier magnifies the level of the current, where the different current results in different voltage rising time. The trip point detect circuit senses the timing tacked for the output voltage to reach a certain level.

Figures 9A, 9B, 9C:
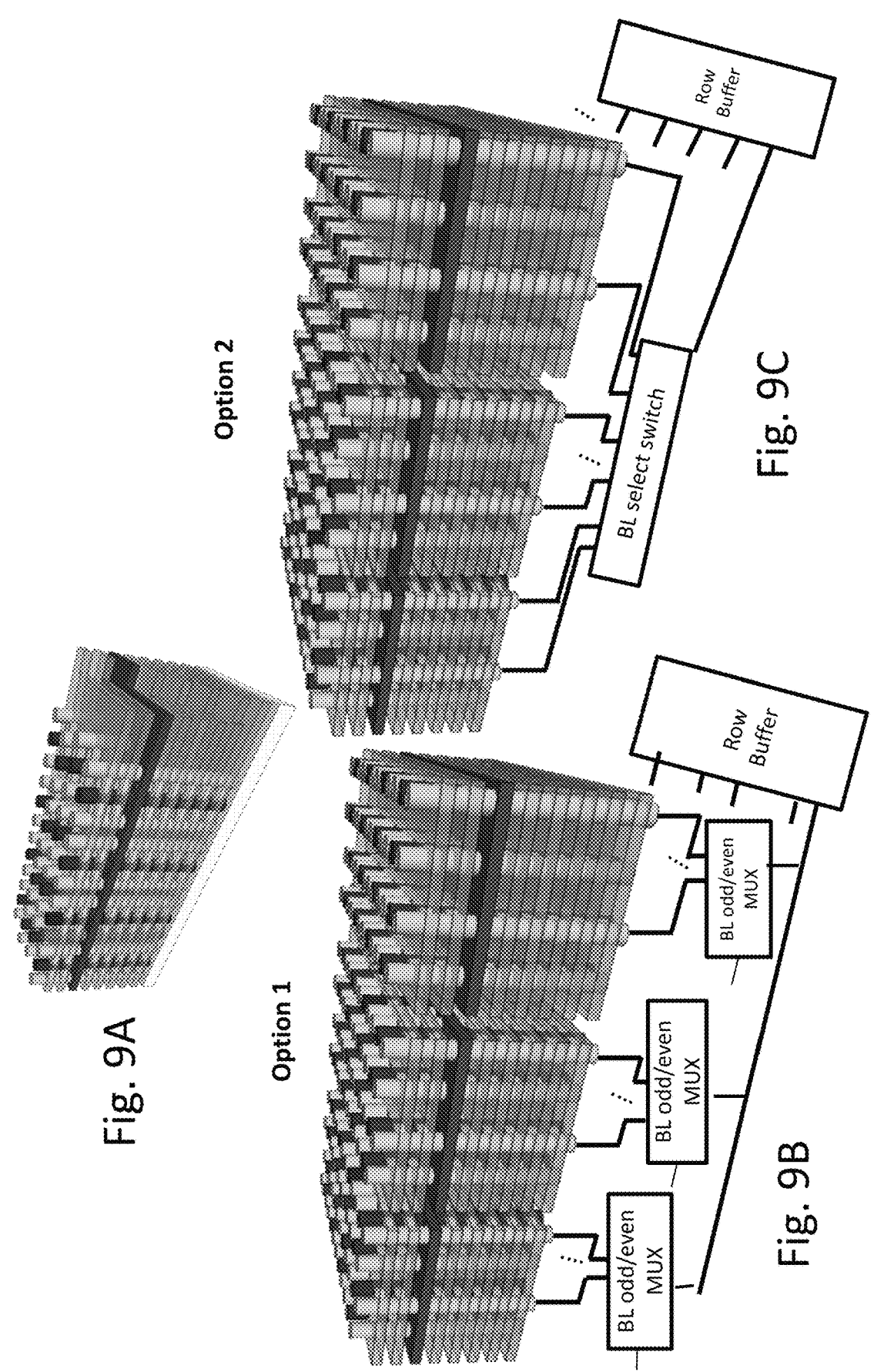
FIGS. 9A-9C are exemplary illustrations of array options with SL/BL select transistors under the 3D-NOR memory array.

FIG. 9A illustrates a 3D NOR-P option having control logic circuitry, which is often called periphery under cell or cell over periphery. The S/D lines could be called bit lines or sometimes the Source lines could be called select-lines (SL) and the Drain-lines could be called bit lines. The planes such as WL layers are crossing multiple pillars. A sense amplifier is placed underneath every pillar and dedicated for each respective BL pillar.

FIG. 9B illustrates the fine-grained memory tile or block. One memory tile or block includes two BL pillars sharing a common global BL. The one BL pillar out of two BL pillars in the same memory block can be selected by using a two to one multiplexor. Alternatively, for larger grained memory tiles or blocks having n BL pillars sharing a common global BL, one out of n BL pillars can be selected by using an n-to-1 multiplexor. Then, the selected BL signal is connected to the global sense amplifier or row buffer. Alternatively, a local sense amplifier is placed underneath every fine-grained memory tile and dedicated for respective memory tiles (not drawn), and then fed into the global row buffer.

FIG. 9C illustrates the use of only global sense amplifiers by selecting only one out of many BLs. In this case, the BL capacitance is significantly reduced, thereby improving latency timing parameters.

One disadvantage of a 3D NOR-P device having an ultra-thin (less than 0.5 nm) tunneling oxide for DRAM applications is the extra energy associated with the memory refresh operation. Yet in most systems, the memory used is relatively large and could include multiple devices. In such systems most of the memory is in a hold state while only one device and only one section within the device is been accessed. An optional technique which could help reduce the need for refresh is a "Hold" state for the device or for device sections. In such a "Hold" state all the wordlines of the device or the section of the device being held in Hold state could be pulled high to a Hold voltage such as about 0.5 volt or about 1 volt or even higher than 1.5 volts. Such a Hold voltage for the wordlines could help keep the trapped charge trapped yet it is low enough not to cause more charge to be trapped. Such a Holding voltage could be removed and replaced with the normal operating voltage(s) once the device or the section being accessed or get other forms of instruction to get out of Hold state into normal operating state. Such holding voltage could be designed as active or passive (via diode) to nodes 402 of FIG. 4A or included as part of the memory control circuits. An artisan in the memory art can design the detailed circuit for such an improved memory control. This technique is also useful for mitigating memory cell Vt drift due de-trapping and leakage caused by total ionizing dose effects, for example, such as from gamma rays, for radiation hardening objectives.

An alternative concept could also be used to nullify the effect of this undesired charge trapping. This could allow managing the cases in which the undesired charge trapping is varying between different cells in the memory block. In such cases the read process could be replace with: $1^{st}$ Read, Write 'One', $2^{nd}$ Read and measure difference Δ between the results of $1^{st}$ Read, vs. the $2^{nd}$ Read. A cell that was 'One' the difference Δ would be smaller than a set threshold while a cell that was 'Zero' the difference Δ would be higher than the set threshold. Such a self-differential read cycle would need a final step of re-writing 'Zero' for the 'Zero' cells.

An additional alternative for high speed memory using the 3D NOR-P structure is the use of the FB-RAM concept as presented in reference to FIG. 29A-29D of PCT/US2018/016759, incorporated herein by reference. The FB-RAM could have a back-bias for keeping the charge in the floating body or to use a re-fresh such as the Auto-Refresh technique presented in respect to FIG. 86-FIG. 88 of U.S. Pat. No. 10,014,318, incorporated herein by reference. Such 3D NOR-P structure could use Source and or Drain pillars which have N+ type polysilicon at the outer ring and a core of metal; or even use the technology of Dopant Segregated Schottky Barrier ("DSSB") for at least the memory transistors.

The multi-level 3D structure could utilize a hybrid of memory types, for example, such as one with an ultra-thin tunneling oxide and others with thick tunneling oxide, as presented in the incorporated art such of PCT/US2016/52726, incorporated herein by reference, such as had been presented in sections [000121] to [000132] and such as in reference to its FIG. 16A-FIG. 17. These memory variations could be processed within the same 3D memory device allowing lower power transfer of data between the high speed cells to the long retention cells and other advantages.

It will also be appreciated by persons of ordinary skill in the art that the invention is not limited to what has been particularly shown and described hereinabove. For example, the use of SiGe as the designated sacrificial layer or etch stop layer could be replaced by compatible material or combination of other material including additive materials to SiGe like carbon or various doping materials such as boron or other variations. And for example, drawings or illustrations may not show n or p wells for clarity in illustration. Furthermore, any transferred layer or donor substrate or wafer preparation illustrated or discussed herein may include one or more undoped regions or layers of semiconductor material. Moreover, transferred layer or layers may have regions of STI or other transistor elements within it or on it when transferred. Rather, the scope of the invention includes combinations and sub-combinations of the various features described hereinabove as well as modifications and variations which would occur to such skilled persons upon reading the foregoing description. Thus, the invention is to be limited only by appended claims.

We claim:

1. A 3D memory device, the device comprising:
a first structure comprising a plurality of memory cells,
wherein each memory cell of said plurality of memory cells comprises at least one memory transistor,
wherein each of said at least one memory transistor comprises a source, a drain, and a channel,
wherein said memory cell comprises at least one charge trap structure, and
wherein said at least one memory transistor is self-aligned to an overlaying another said at least one memory transistor, both being processed following a same lithography step; and
a control level comprising a memory controller circuit,
wherein said control level comprises a plurality of temperature sensors,
wherein said memory controller circuit comprises a calibration mode control circuit, wherein said control level is bonded to said first structure, and wherein said bonded comprises hybrid bonding.

2. The device according to claim 1, wherein said channel comprises polysilicon, wherein said source and/or said drain comprises metal atoms, and wherein said metal atoms enable hot electron programming of said charge trap memory.

3. The device according to claim 1, further comprising:
a bottom level comprising a first crystallized silicon layer; and
a top level comprising a second crystallized silicon layer, wherein said bottom level is overlaid by said first structure, and wherein said first structure is overlaid by said top level.

4. The device according to claim 1, wherein said control level comprises a plurality of latch sense amplifiers.

5. The device according to claim 1, wherein at least one of said channel comprises recrystallized material.

6. The device according to claim 1, wherein said memory controller circuit comprises a row buffer.

7. The device according to claim 1, wherein said memory controller circuit comprises a configuration to perform a self-differential read cycle.

8. A 3D memory device, the device comprising:
a first structure comprising a plurality of memory cells, wherein each memory cell of said plurality of memory cells comprises at least one memory transistor, wherein each of said at least one memory transistor comprises a source, a drain, and a channel;
a plurality of memory-line pillars, wherein said plurality of memory-line pillars are vertically oriented, and wherein said at least one memory transistor is self-aligned to an overlaying another said at least one memory transistor, both being processed following a same lithography step; and
a control level comprising a memory controller circuit, wherein said memory controller circuit comprises a plurality of a row buffers, wherein said memory controller circuit comprises a configuration to perform a differential read cycle, wherein said control level is bonded to said first structure, and wherein said bonded comprises hybrid bonding.

9. The device according to claim 8, wherein each of said at least one memory transistor is directly connected to at least one of said plurality of memory-line pillars.

10. The device according to claim 8, wherein at least one of said plurality of memory cells comprises a tunneling oxide thinner than 1 nm.

11. The device according to claim 8, wherein said plurality of memory cells comprise a partially or fully metalized source, and/or, a partially or fully metalized drain.

12. The device according to claim 8, wherein each memory cell of said plurality of memory cells comprises a charge trap memory, wherein said channel comprises polysilicon, wherein said channel is horizontally oriented, wherein said source and/or said drain comprises metal atoms, and wherein said metal atoms enable hot electron programming of said charge trap memory.

13. The device according to claim 8, wherein said control level comprises a plurality of temperature sensors.

14. The device according to claim 8, wherein said memory controller circuit comprises a calibration mode control circuit.

15. A 3D memory device, the device comprising:
a first structure comprising a plurality of memory cells, wherein each memory cell of said plurality of memory cells comprises at least one memory transistor, wherein each of said at least one memory transistor comprises a source, a drain, and a channel;
a plurality of memory-line pillars, wherein said plurality of memory-line pillars are vertically oriented, and wherein said at least one memory transistor is self-aligned to an overlaying another said at least one memory transistor, both being processed following a same lithography step; and
a control level comprising a memory controller circuit, a bottom level comprising a first crystallized silicon layer; and
a top level comprising a second crystallized silicon layer, wherein said bottom level is overlaid by said first structure, wherein said first structure is overlaid by said top level, wherein said memory controller circuit comprises a calibration mode control circuit, wherein said control level is bonded to said first structure, and wherein said bonded comprises hybrid bonding.

16. The device according to claim 15, wherein said memory controller circuit comprises a row buffer.

17. The device according to claim 15, wherein said control level comprises a plurality of temperature sensors.

18. The device according to claim 15, wherein said memory controller circuit comprises a plurality of a row buffers.

19. The device according to claim 15, wherein said channel comprises recrystallized polysilicon.

20. The device according to claim 15, wherein said memory controller circuit comprises a configuration to perform a differential read cycle.

* * * * *